United States Patent
Hosokawa

(10) Patent No.: US 7,228,513 B2
(45) Date of Patent: Jun. 5, 2007

(54) CIRCUIT OPERATION VERIFICATION DEVICE AND METHOD

(75) Inventor: Kohei Hosokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 178 days.

(21) Appl. No.: 10/935,271

(22) Filed: Sep. 8, 2004

(65) Prior Publication Data

US 2005/0055190 A1    Mar. 10, 2005

(30) Foreign Application Priority Data

Sep. 9, 2003    (JP) .............................. 2003-316197

(51) Int. Cl.
*G06F 17/50* (2006.01)
(52) U.S. Cl. ............................................. 716/5; 716/4
(58) Field of Classification Search ................ 716/4–6, 716/2, 18
See application file for complete search history.

(56) References Cited

U.S. PATENT DOCUMENTS

| | | | |
|---|---|---|---|
| 6,106,567 A * | 8/2000 | Grobman et al. ............... | 716/5 |
| 6,279,146 B1 * | 8/2001 | Evans et al. .................. | 716/18 |
| 6,591,402 B1 * | 7/2003 | Chandra et al. ............... | 716/5 |
| 2003/0126563 A1 * | 7/2003 | Nakajima ...................... | 716/1 |

FOREIGN PATENT DOCUMENTS

JP        2000-215226 A        8/2000

* cited by examiner

*Primary Examiner*—Jack Chiang
*Assistant Examiner*—Binh Tat
(74) *Attorney, Agent, or Firm*—Foley & Lardner LLP

(57) ABSTRACT

A circuit verification device includes emulators to which circuit portions obtained by dividing the circuit are implemented. The emulators communicate with each other through a bus to verify the functional operation of the circuit. The circuit is divided based on a communication occurrence pattern between circuit units so that the number of communications occurring between circuit portions is minimized. The input signals of the bus are preferably arranged in the bus address space in descending order of a signal change rate, and a burst transfer may be utilized. Through paths within the circuit being verified are searched, and a plurality of circuit units is divided so as to minimize the number of through paths among the circuit portions.

29 Claims, 17 Drawing Sheets

→ TIME

|     | 1 | 2 | 3 | 4 | 5 | 6 | 7 | 8 | 9 |
|-----|---|---|---|---|---|---|---|---|---|
| A-B |   | OCCUR-RENCE |   |   | OCCUR-RENCE |   | OCCUR-RENCE |   |   |
| A-C |   |   |   | OCCUR-RENCE |   |   | OCCUR-RENCE |   |   |
| A-D | OCCUR-RENCE | OCCUR-RENCE |   |   | OCCUR-RENCE | OCCUR-RENCE |   | OCCUR-RENCE | OCCUR-RENCE |
| B-C |   | OCCUR-RENCE | OCCUR-RENCE |   | OCCUR-RENCE | OCCUR-RENCE |   | OCCUR-RENCE |   |
| B-D |   |   |   | OCCUR-RENCE |   |   | OCCUR-RENCE |   | OCCUR-RENCE |
| C-D |   | OCCUR-RENCE |   |   | OCCUR-RENCE |   | OCCUR-RENCE |   |   |

FIG. 9A

| EMULATOR 1 | EMULATOR 2 | TIMES WHEN COMMUNICATION WAS NECESSARY |
|---|---|---|
| A, B | C, D | 1, 2, 3, 4, 5, 6, 7, 8, 9 |
| A, C | B, D | 1, 2, 3, 5, 6, 7, 8, 9 |
| A, D | B, C | 2, 4, 5, 7, 9 |

FIG. 9B

| | NUMBER OF THROUGH PATHS |
|---|---|
| A-B | 1 |
| A-C | 0 |
| A-D | 1 |
| B-C | 1 |
| B-D | 1 |
| C-D | 2 |

DIVISION RESULTS

| EMULATOR 1 | EMULATOR 2 | NUMBER OF THROUGH PATHS |
|---|---|---|
| A, B | C, D | 3 |
| A, C | B, D | 5 |
| A, D | B, C | 4 |

CIRCUIT OPERATION VERIFICATION DEVICE AND METHOD

BACKGROUND OF THE INVENTION

1. Field of the Invention

The present invention relates to a technique for assisting in the design of a logic circuit, and particularly relates to a device and method for executing operational verification of the logic circuit.

2. Description of the Related Art

As the scale of circuits that can be mounted in digital LSI enlarges each year, the issue of increasing the speed of operational verification is becoming more and more important. Methods in general use for enhancing verification speed employ a hardware emulator that uses a programmable device such as FPGA (Field Programmable Gate Array) or CPLD (Complex Programmable Logic Device).

Japanese Laid-open Patent Application No. 2000-215226 discloses a logic verification device which can efficiently perform logic verification in the case where a module in which logic information is defined up to a structural level is mixed with a module in which such definition is not present. Specifically, the circuit being verified is divided into a first part verified by a hardware emulator and a second part verified by a software simulator depending on the level of abstraction of the logic information. The circuit verification is performed by synchronizing the clocks of the hardware emulator and the software simulator to perform mutual transfer of data (see paragraphs 0046 through 0052 and FIGS. 1 and 2). Since the logic being verified is executed not only by the software simulator but by the hardware emulator as well, verification can be performed at a higher speed than with a software simulator alone.

However, division of the circuit in the conventional logic verification device as described above is performed according to the level of abstraction of the logic information, so there is no degree of freedom in the circuit division, and an increase in the speed of verification cannot be achieved.

Furthermore, in the software simulator of the conventional logic verification device described above, data are sent and received to and from the hardware emulator via the CPU system bus, but the arrangement of the data that are sent and received follows the specifications of the system bus (see paragraph 0048 of Japanese Laid-open Patent Application No. 2000-215226). Because of this, the verification speed of the circuit is determined by the transfer speed of the bus, and efficient data transfer cannot be performed.

SUMMARY OF THE INVENTION

In view of the above, an object of the present invention is to provide a circuit verification device and method that allows high-speed verification of the operation of a circuit to be verified.

Another object of the present invention is to provide a circuit verification device and method that make it possible to reduce the number of transmissions between the emulator and the simulator of divided circuits.

A further object of the present invention is to provide a circuit verification device and method that make it possible to enhance the degree of freedom of circuit division.

According to a first aspect of the present invention, a circuit verification device is provided with a plurality of simulation sections for each simulating functional operations of a plurality of circuit portions into which the circuit is divided. The plurality of simulation sections are connected vie a bus to enable mutual communications and the bus controller is controlled for communications among the plurality of simulation sections to verify the functional operation of the circuit to be verified.

In each of the plurality of simulation sections, input signals from the bus and output signals to the bus are preferably arranged in a bus address space in descending order of a signal change rate. Input signals and output signals of each of the plurality of simulation sections are preferably transmitted and received in burst transfer when signals to be transferred are placed at addresses in proximate to each other.

It is preferable that signals of through paths existing among the plurality of simulation sections are bundled and placed in a portion of the bus address space in each of the plurality of simulation sections. The signals of the through paths are transferred in burst when the bus controller operates as a bus master.

Each of the plurality of simulation sections may be a software-based simulator or an emulator that uses a programmable device.

According to a second aspect of the present invention, a circuit operation verification method includes: a) dividing the circuit into a plurality of circuit portions so that the number of communications among the plurality of circuit portions is minimized when the circuit is divided into the plurality of circuit portions; b) connecting a plurality of simulation circuits so as to enable mutual communication via a bus, wherein the plurality of simulation circuits each simulate functional operations of the plurality of circuit portions; and c) verifying the functional operation of the circuit by communicating among the plurality of simulation circuits.

The step a) preferably includes: a1) inputting a temporal communication occurrence pattern obtained from an arbitrary combination of a plurality of circuit units constituting the circuit; and a2) dividing the plurality of circuit units into a plurality of circuit portions based on the temporal communication occurrence pattern of the plurality of circuit units so that the number of communications occurring among the plurality of circuit portions is minimized.

Alternatively, the step a) preferably includes: a1) searching for a through path among a plurality of circuit units constituting the circuit; and a2) dividing the plurality of circuit units into a plurality of circuit portions so that the number of through paths among the plurality of circuit portions is minimized.

As described above, in accordance with the present invention, a plurality of simulation sections is connected by a bus, whereby the degree of freedom in dividing a circuit wan be enhanced and the speed of operational verification by circuit division can be increased.

The speed of operational verification can also be increased by dividing a circuit to be tested so that the number of communications among a plurality of circuit portions is minimized when the circuit is divided into the plurality of circuit portions.

A plurality of circuit units can be divided so that the number of communications occurring between the divided circuit portions is minimized by using the temporal communication occurrence pattern in all combinations of the plurality of circuit units constituting the circuit.

Furthermore, a burst transfer can be utilized and the number of communications can be reduced in the case of the address of a changed signal being in proximity to each other by arranging the signals inputted from the bus and the signals outputted to the bus in a bus address space in descending order of a signal change rate.

Through paths among the plurality of circuit units are searched for and a plurality of modules is divided so that the number of through paths is minimized among the plurality of circuit portions. In a through path, signals only passing through a circuit portion, so the number of transmissions between circuit portions can be reduced by performing the division so that the number of through paths is minimized.

BRIEF DESCRIPTION OF THE DRAWINGS

FIG. 9A is a diagram showing an example of communication occurrence pattern in which the presence of transmissions between all the circuits is recorded in time increments;

FIG. 9B is a diagram showing relationship between a method of circuit division and the number of transmissions;

DESCRIPTION OF THE PREFERRED EMBODIMENTS

1. First Embodiment 1.1) System Structure

Figure 1:
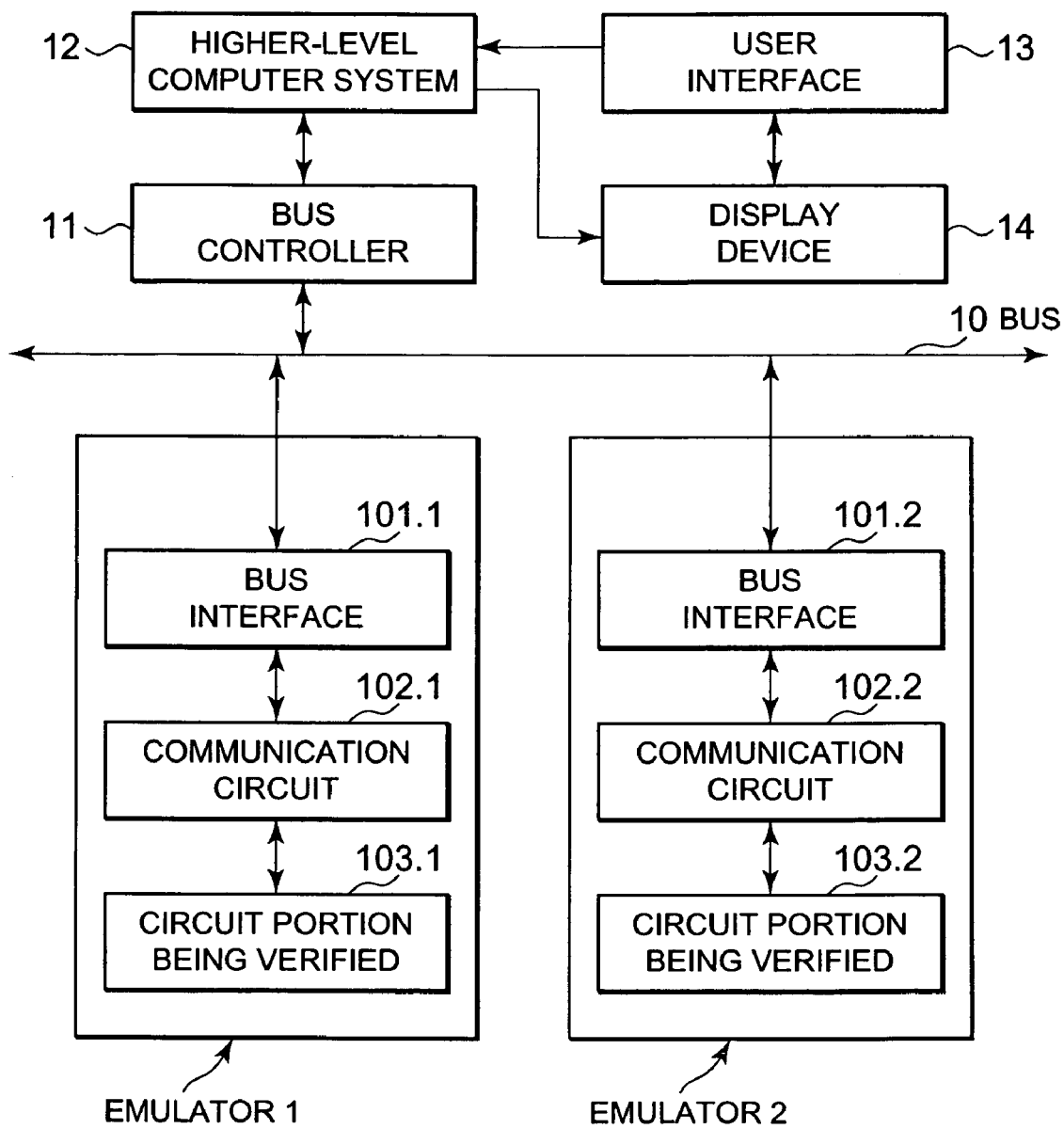
FIG. 1 is a schematic block diagram snowing a circuit verification device according to a first embodiment of the present invention.

Referring to FIG. 1, a circuit to be verified, which is composed of a plurality of circuit elements and/or a plurality of modules, is divided into two circuit portions 103.1 and 103.2, which are mounted in emulators 1 and 2, respectively. The emulators 1 and 2 are connected by a bus 10, which is further connected to a bus controller 11. In the present embodiment, each of the bus controller 11, emulator 1 and emulator 2 can become a bus master of the bus 10.

A higher-level computer system 12 is connected to the bus controller 11, user interface 13, and display device 14. A user can control the operation of the bus controller 11 by using the user interface 13. Information obtained via the bus controller 11 is presented to the user by the display device 14. For example, the user can change input signal values of circuit portions 103.1 and 103.2 that are being verified and are mounted to the emulator 1 and the emulator 2, respectively, via the user interface 13 and the display device 14.

The operation of the bus controller 11 is defined by commands received from the higher-level computer system 12 so that the bus control right of the emulators 1 and 2 capable of being the bus master is arbitrated. The bus controller 11 as such can also be the bus master, and can write and read data for the emulators 1 and 2.

The emulators 1 and 2 have the same structure except for the respective divided circuits 103.1 and 103.2 mounted thereto. The emulator 1 has a bus interface 101.1 that is connected to the bus 10 and enables data exchange, a circuit portion 103.1 being verified, and a communication circuit 102.1 that connects the bus interface 101.1 and the circuit portion 103.1 to enable mutual communications as described hereinafter. Similarly, the emulator 2 has a bus interface 101.2, a circuit portion 103.2 being verified, and a communication circuit 102.2. The structure of the emulators will be described in detail hereinafter.

Figure 2:
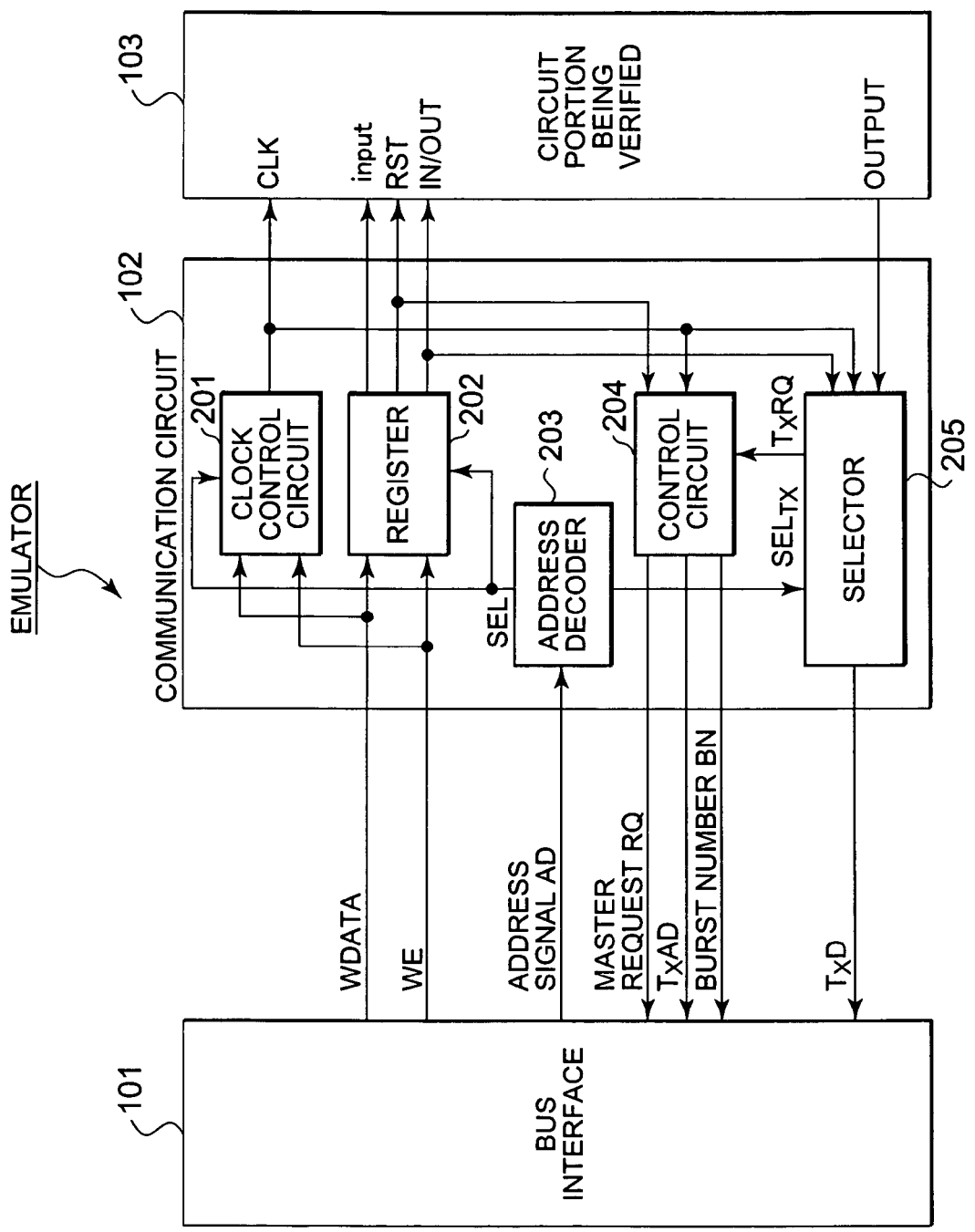
FIG. 2 is a block diagram showing the detailed structure of an emulator in the first embodiment of the present invention.

As shown in FIG. 2, both the emulators 1 and 2 have the basic structure composed of the bus interface 101, the communication circuit 102, and the circuit portion 103 being verified. The communication circuit 102 presents write data WDATA or other data inputted from the bus interface 101 to the circuit portion 103 being verified as an input signal input, selects an output signal output from the circuit portion 103 being verified according to an address signal AD inputted from the bus interface 101 to transfer a selected signal as TxD to the bus interface 101.

More specifically, the communication circuit 102 has a clock control circuit 201, a register 202, an address decoder 203, a control circuit 204, and a selector 205. The clock control circuit 201 inputs the write data WDATA, write enable signal WE, and select signal SEL to generate a clock signal CLK, which is fed to the circuit portion 103 being verified, control circuit 204, and selector 205. The register 202 inputs the write data WDATA, write enable signal WE, and select signal SEL to generate an input signal input, input/output signal in/out, and reset signal RST, which are outputted to the circuit portion 103 being verified. The address decoder 203 decodes the address signal AD inputted from the bus interface 101, generates select signals SEL and $SEL_{TX}$. The select signal SEL is supplied to the clock control circuit 201 and the register 202, and the select signal $SEL_{TX}$ is supplied to the selector 205. The control circuit 204 outputs a master request RQ, transmit address signal TxAD, and burst number BN to the bus interface 101 in response to a transmit request signal TxRQ from the selector 205 according to the clock signal CLK and reset signal RST. The selector 205 selects transmit data TxD from the output signal output and input/output signal in/out of the circuit portion 103 being verified according to the select signal $SEL_{TX}$ to output it to the interface 101, and generates a transmit request signal TxRQ on the basis of the output signal output and input/output signal in/out to output it to the control circuit 204.

An address is allocated to each of input signals in the input/output signal in/out and the input signal input, and to each of output signals in the input/output signal in/out and the output signal output of the circuit portion 103 being verified. The maximum bit number of data specified by a single address is equivalent to the bit width of the write data WDATA and transmit data TxD. An address based on the address signal AD may be a portion of the address space of the bus 10 or an address of another space. It is essential only that the bus can use such an address to uniquely determine the position of data of the circuit portion 103 being verified and, if the address signal AD is not a portion of the address space of the bus 10, then the bus interface 101 performs a necessary address conversion. However, data of an emulator with different connection destinations cannot be allocated to a single address in the data address allocation.

Figure 3A:
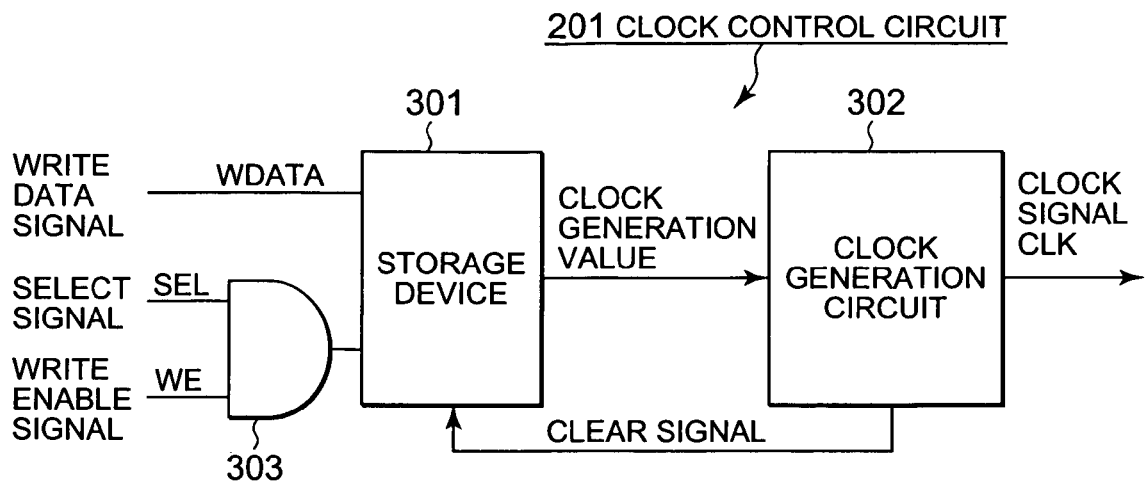
FIG. 3A is a block diagram showing a clock control circuit in the first embodiment.

As shown in FIG. 3A, the clock control circuit 201 is composed of a storage device 301, a clock generation device 302, and an AND gate 303. When both the select signal SEL and the write enable signal WE have become active, the storage device 301 latches the value of the write data WDATA and outputs that value to the clock generation circuit 302 as the clock generation value. The data retained by the storage device 301 is also reset by the clear signal from the clock generation circuit 302. The clock generation circuit 302 changes the waveform of the clock signal CLK according to the clock generation value from the storage device 301 and outputs the clear signal to the storage device 301 when finished.

Figure 3B:
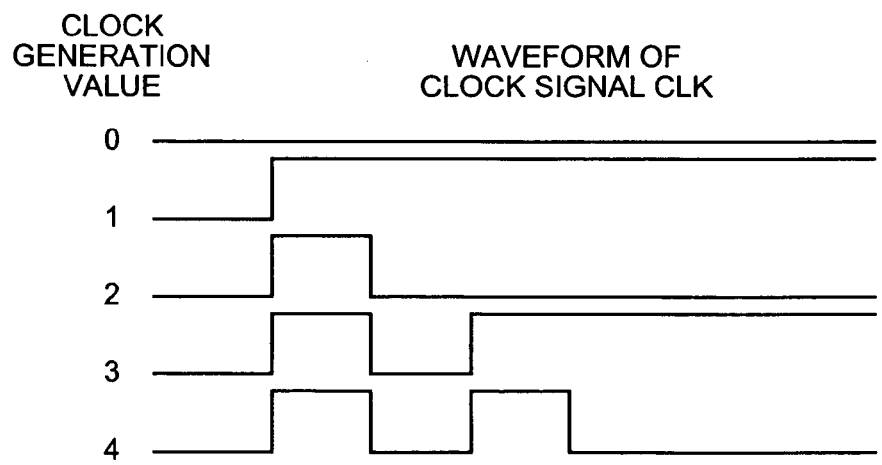
FIG. 3B is a waveform diagram depicting an example of a clock waveform generated by the clock control circuit of FIG. 3A.

As shown in FIG. 3B, more specifically, the clock generation circuit 302 varies the clock signal CLK N times when the clock generation value is N. For example, when the clock generation value is 1, the clock signal CLK is changed (caused to rise) once, and when the clock generation value is 2, the clock signal CLK is changed (caused to rise and fall) twice, and so on. After the clock signal CLK is changed as many times as the clock generation value in this manner, the clear signal is made active, the value of the storage device 301 is reset to zero, and changing of the clock signal CLK is stopped.

Since the clock signal CLK can be changed as many times as indicated by the write data WDATA as described above, it becomes possible that the clock signal CLK of the circuit portion 103 being verified can be changed by any device connected to the bus 10.

Figure 4:
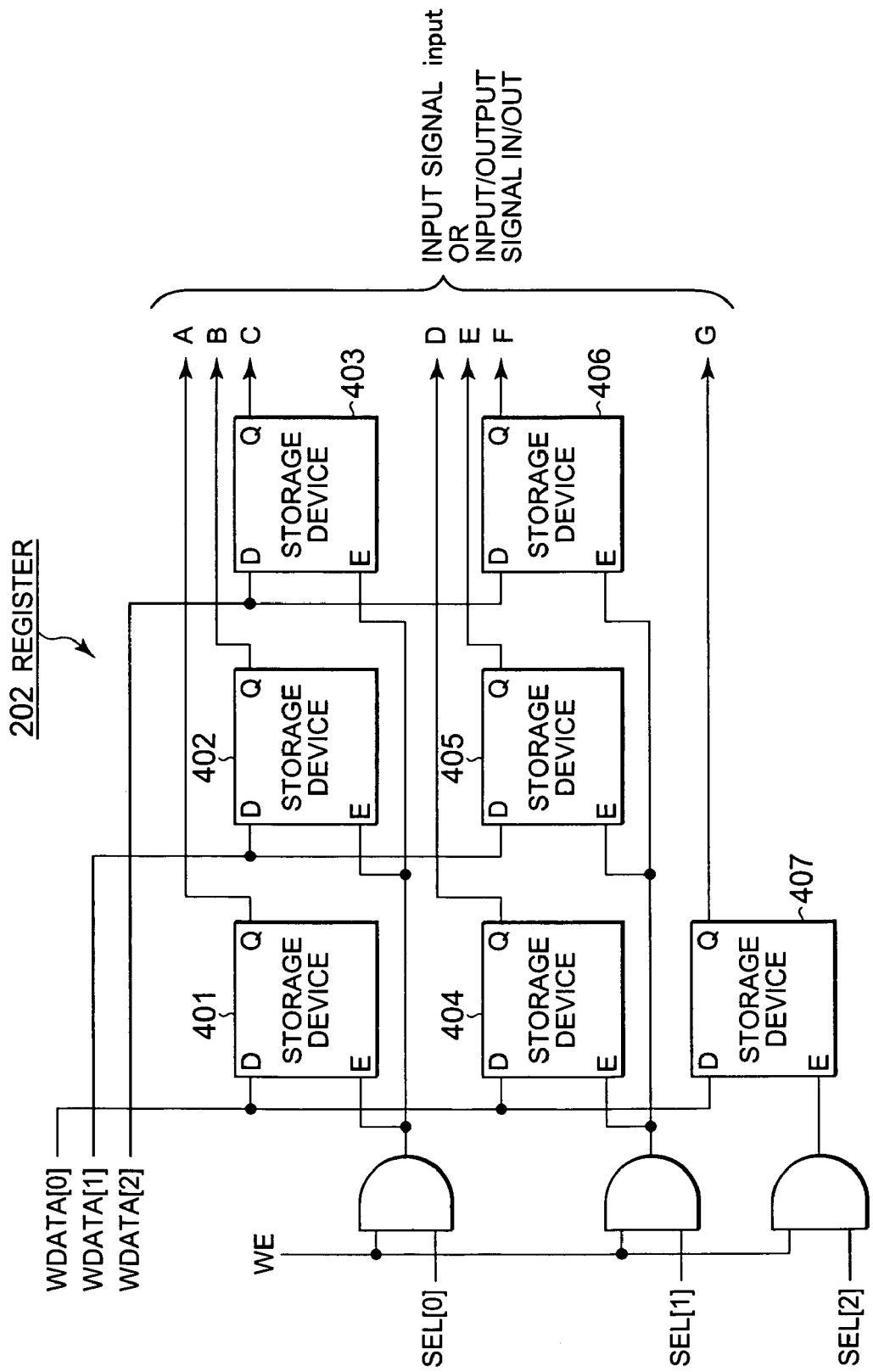
FIG. 4 is a block diagram showing a register in the first embodiment.

Referring to FIG. 4, the register 202 has the same number of storage devices 401 through 407 as the total number of input signals in the input/output signal in/out and the input signal input of the circuit portion 103 being verified. An example is described of a case in which the bit width of the write data WDATA is 3 and the total number of input signals and input/output signals of the circuit portion 103 being verified is 7. Also, A, B, C, D, E, F, and G in the diagram indicate the seven input signals and input/output signals. The storage devices 401 through 407 operate according to the clock signal inputted from the bus interface 101, but the clock signal is not shown for the sake of simplicity. The [x] in the write data WDATA[0] through WDATA[2] and in the select signals SEL[0] through SEL[2] indicates a bit position in that signal.

By configuring the register 202 as shown in FIG. 4, each storage device can be uniquely specified from the bus 10, and it is possible that the values of all the input signals and input/output signals A, B, C, D, E, F, and G of the circuit portion 103 being verified can be changed by any device connected to the bus 10. For example, if the write data WDATA[0] through WDATA[2]=(1, 0, and 0), and the select signals SEL[0] through SEL[2]=(1, 0, and 0) when the address signal AD is decoded, then the write enable signal WE becomes "active," and the data "1," "0," and "0" are retained in the storage devices 401 through 403, respectively, when the clock (not shown) rises.

Figure 5:
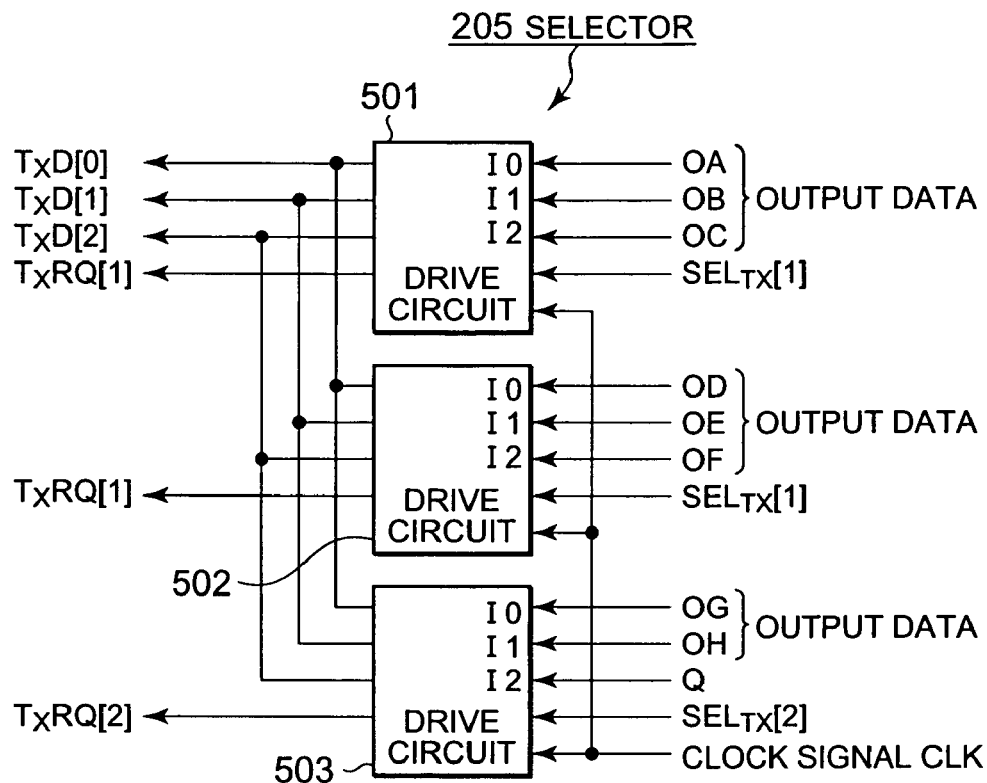
FIG. 5 is a block diagram showing a selector in the first embodiment.

Referring to FIG. 5, an example is shown herein of a case in which the bit width of the transmit data TxD is 3 and the total number of output signals in the input/output signals in/out and the output signals output of the circuit portion 103 being verified is 8. OA, OB, OC, OD, OE, OF, OG, and OH in the figure indicate the output signal output of the circuit portion 103 being verified.

The selector 205 is composed of three drive circuits 501 through 503. In the drive circuit 501, the output signals OA, OB, and OC from the circuit portion 103 being verified are inputted to the input terminals I0 through I2, respectively, and the select signal $SEL_{TX}[0]$ and the clock signal CLK are also inputted thereto. The output signals OD, OE, and OF from the circuit portion 103 being verified are inputted to the input terminals I0 through I2, respectively, in the drive circuit 502, and the select signal $SEL_{TX}[1]$ and clock signal CLK are also inputted thereto. The output signals OG and OH and a "0" from the circuit portion 103 being verified are inputted to the input terminals I0 through I2, respectively, in the drive circuit 503, and the select signal $SEL_{TX}[2]$ and clock signal CLK are also inputted thereto. The three output terminals of the drive circuits 501 through 503 are each connected, and three-bit transmit data TxD[0] through TxD[2] are outputted to the bus interface 101. As described hereinafter, the drive circuits 501 through 503 also output transmit request signals TxRQ[0] through TxRQ[2], respectively, to the control circuit 204.

Figure 6:
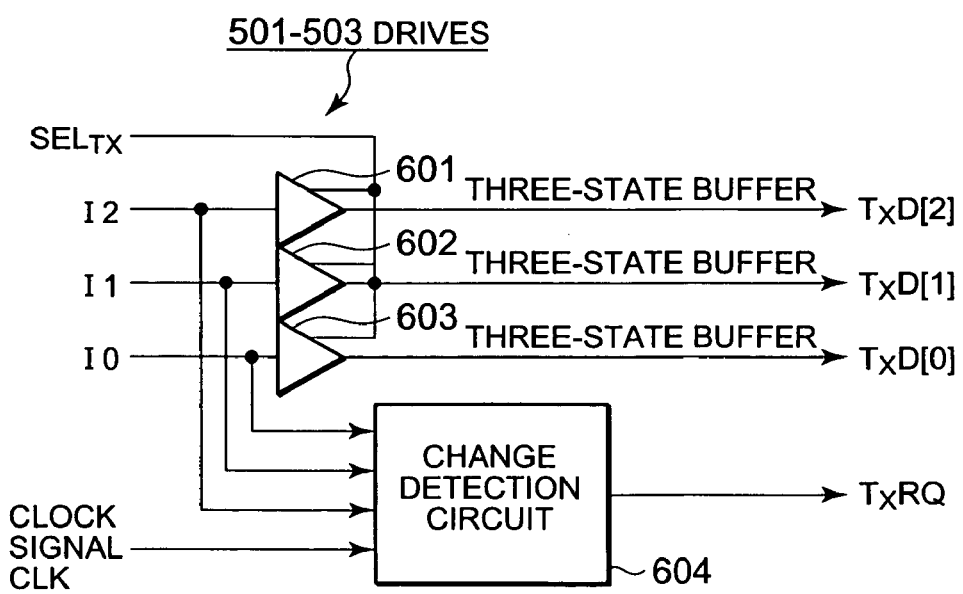
FIG. 6 is a detailed circuit diagram showing a drive circuit of FIG. 5.

Referring to FIG. 6, each of the drive circuits 501 through 503 has three-state buffers 601 through 603 and a change detection circuit 604, respectively. The three-state buffers 601 through 603 each use the data inputted from the input terminals I0 through I2 as input, and output the transmit data TxD[0] through TxD[2] with the select signal $SEL_{TX}$ as a control signal. It is preferable that three-state buffers provided by a programmable device to which the circuit being verified is implemented are used for the three-state buffers 601 through 603.

The change detection circuit 604 inputs the clock signal CLK from the clock control circuit 201 and the data from the input terminals I0 through I2, detects whether there is a change from the input signal of the previous cycle, and outputs a transmit request signal TxRQ when there is a change.

Figure 7:
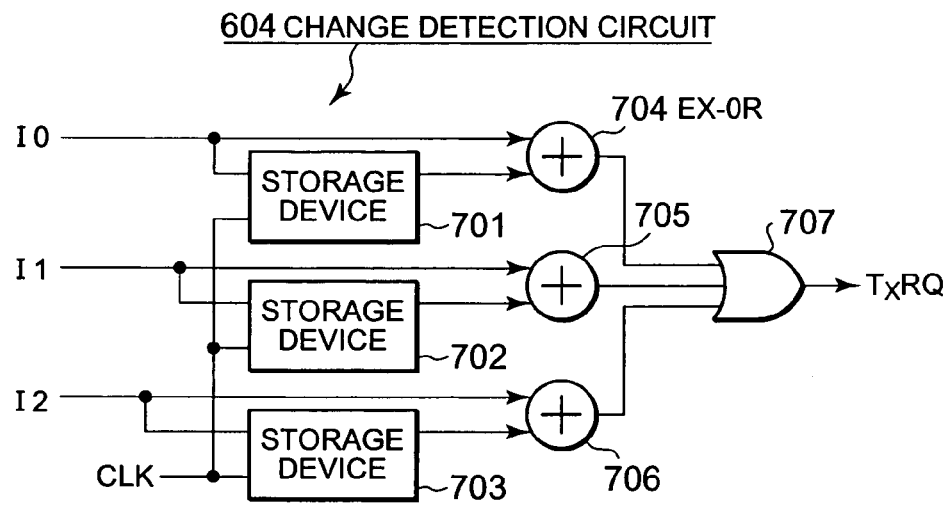
FIG. 7 is a detailed circuit diagram showing a change detection circuit of FIG. 6.

Referring to FIG. 7, the change detection circuit 604 has storage devices 701 through 703 that respectively correspond to the input terminals I0 through I2, and retains the data from the input terminals I0 through I2 at the timing of the clock signal CLK. The exclusive OR between the data from the input terminals I0 through I2 and the data of the previous cycle retained by the storage devices 701 through 703 is further calculated by the EX-OR 704 through 706, and the result is outputted as a transmit request signal TxRQ via the OR gate 707.

When the transmit request signal TxRQ that corresponds to the address specified by the select signal $SEL_{TX}$ becomes active, the control circuit 204 outputs the address to the bus interface 101 as a transmit address signal TxAD and sets the master request RQ to "active." A request is thereby made to the bus interface 101 to output the transmit data TxD from the selector 205 to the bus 10.

When the master request RQ becomes active, the bus interface 101 requests of the bus controller 11 the right to use the bus 10, and becomes the bus master of the bus 10 when the request is granted. The bus interface 101 then executes data transfer for the bus 10 according to the, value of the burst number BN and the transmit address signal TxAD. However, when the bus interface 101 operates as the master of the bus 10, an address signal AD is continually outputted so that the selector 205 selects the transmit data TxD corresponding to the address.

Figure 8:
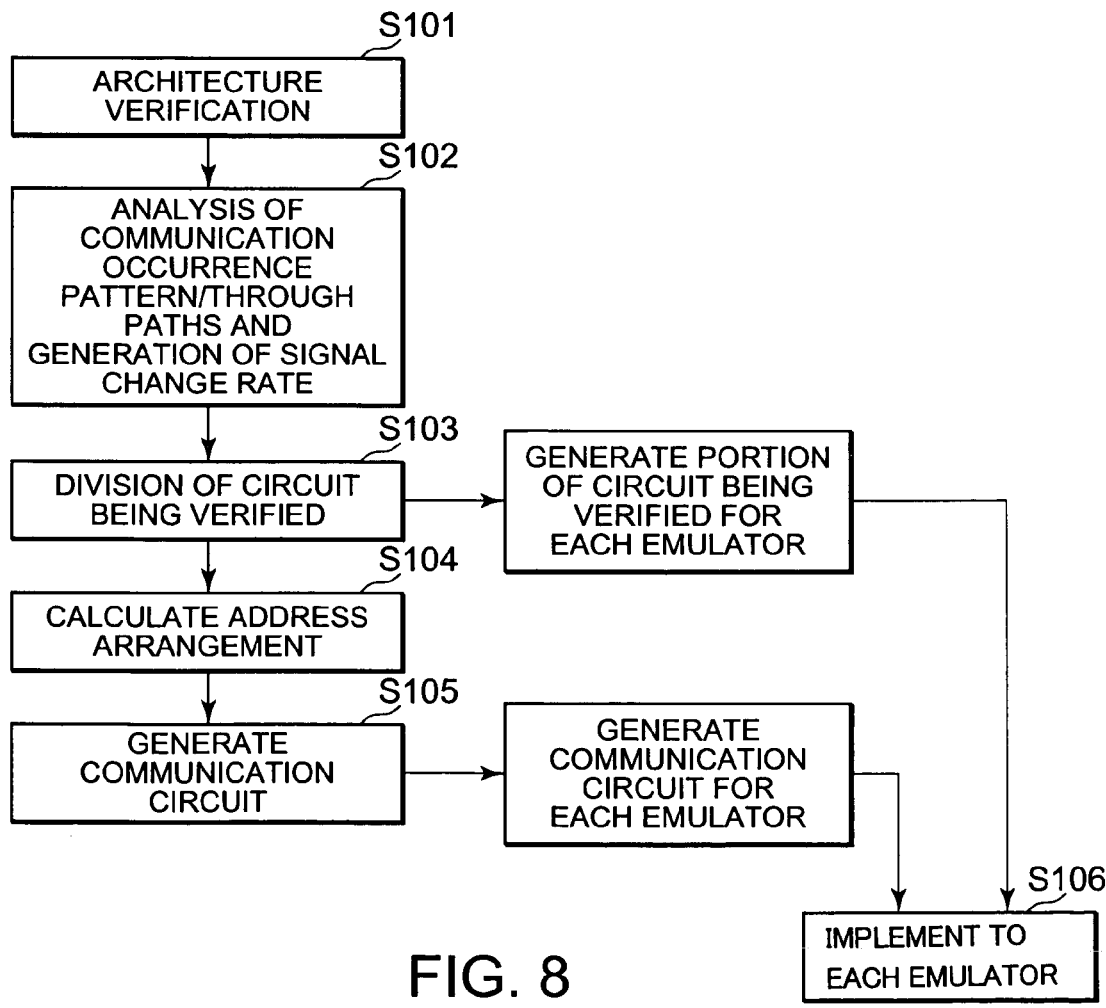
FIG. 8 is a flowchart showing the overall flow up to the point at which the circuit to be verified is divided and implemented on a plurality of emulators.

Referring to FIG. 8, first, the entire circuit composed of a plurality of implemented circuits is simulated and the waveforms of all signals in the entire circuit are calculated (Architecture verification: step S101). Computation of the signal change rate of each signal from the signal waveforms thus found, computation of a communication occurrence pattern necessary for circuit division, and/or searching of through paths for the entire circuit are then performed (step S102). The communication occurrence pattern and the through path will be described hereinafter. Also, a user may also provide the information necessary for circuit division through the user interface 13.

The entire circuit is then divided based on the communication occurrence pattern and/or through path information, but this division is performed so that, when the circuit being verified is divided into a plurality of implemented circuits, the number of communications between these implemented circuits is minimized (step S103), which will be described later.

Subsequently, arrangement in the bus address space is determined for the inputs and outputs of the circuit portions (103.1 and 103.2) that are being verified and are implemented to the emulators (step S104). This process is described in detail hereinafter, but in order for the burst transfer to be executed efficiently, address arrangement of the input signals input, input/output signals in/out, and output signals output is determined based on the signal change rate. The communication circuit 102 is generated from the address arrangement thus determined (step S105).

When a divided circuit being verified is generated for each emulator in step S103 and a communication circuit 102 is generated for each emulator in step S105, a circuit portion being verified and a communication circuit for each emulator are implemented in a corresponding emulator (step S106). The implementation method differs according to the structure of an emulator. For example, in the case where one emulator is composed of a single programmable device, in substitution for preparing the bus interface 101 and communication circuit 102, a top-level circuit in which the circuit portion being verified, the communication circuit 102, and the bus interface 101 are instanced may be synthesized using a synthesis tool, and the result is arranged and wired to configure a programmable device.

1.2) Circuit Division

The method of dividing a circuit being verified (steps S101 through S103) will next be described in further detail. In the present embodiment, a division method based on a communication occurrence pattern and a division method based on through path information may be used. As described above, the circuit to be verified that is composed of a plurality of circuit elements and/or a plurality of modules is divided so as to minimize the number of communications through the bus 101 among the plurality of emulators to which the divided circuit portions are implemented. Here, it is assumed that the circuit being verified is composed of a plurality of circuit units, each of which is composed of one or more circuit elements.

Circuit Division Based on Communication Occurrence Pattern

A basic sequence of circuit division based on a communication occurrence pattern is as follows:

A1) reading hardware description language of the circuit to be verified that is composed of a plurality of circuit units, and analyzing interconnections of the circuit units indicating that the input and output of which circuit unit are connected to which circuit unit;

A2) computing the number of emulators, the circuit scale of each emulator, and the circuit scale of each circuit unit, where the number of emulators and the circuit scale of each emulator are manually given by the user, and the circuit scale of each circuit unit is estimated by reading the hardware description language for the corresponding circuit unit;

A3) operating the circuit being verified as a whole using a software simulator or the like, storing the number of times the input/output signal of each circuit unit has been changed and time instants of changes, and generating a temporal communication occurrence pattern between each combination of circuit units; and A4) dividing the circuit being verified on the basis of the information obtained in the above-described steps A1 through A3 so that the number of communications between emulators is minimized. For example, by calculating the number of communications for all combinations whereby the plurality of circuit units constituting the circuit being verified is allocated to the plurality of emulators (full searching), the combination with the lowest number of communications is selected, whereby the method of division can be determined. At that time, the number of communications between emulators can be further reduced if division can be performed so that a divided circuit is approximately equivalent to the circuit scale that can be emulated by a single emulator.

A simple example will be described to aid in understanding circuit division based on the communication occurrence pattern. It is assumed herein that four circuits A, B, C, and D are implemented to two emulators 1 and 2, and it is also assumed that the circuit scale of each circuit is about 40% of the circuit scale that enables implementing to each emulator.

As shown in FIG. 9A, the presence or absence of communication performed between circuits in all combinations during time 1 through time 9 is recorded to obtain a communication occurrence pattern. For example, in the combination of circuits A and D, communications are generated at times 1, 2, 5, 6, 8, and 9.

The number of communications between emulators is then counted from the information shown in FIG. 9A for all cases in which the four circuits A, B, C, and D were allocated to the emulators 1 and 2, as shown in FIG. 9B. For example, when circuits A and B are allocated to emulator 1, and circuits C and D are allocated to emulator 2, a communication is present at times 4 and 7 between circuit A of emulator 1 and circuit C of emulator 2; a communication is present at times 1, 2, 5, 6, 8, and 9 between circuits A and D; and a communication is present at times 2, 3, 5, 6, and 8 between circuits B and C, so it is apparent that communications are ultimately needed at all of times 1 through 9.

In this manner, by finding a communication occurrence pattern for each combination of circuits, and calculating the number of communications in all possible allocations from the communication patterns thereof as described above, it is found that implementing circuits A and D to emulator 1 and circuits B and C to emulator 2 as shown in FIG. 9B is the method of division that yields the lowest number of communications.

Circuit Division Based on Through Path Information

A through path is defined as a path that does not include a storage device between the input and output of a circuit being verified that is emulated by each emulator. The number of communications is high if the number of through paths between emulators is large, so the circuit is preferably divided so that the number of through paths between emulators is as low as possible.

A basic sequence of circuit division based on through path information is as follows:

B1) reading hardware description language of the circuit to be verified that is composed of a plurality of circuit units, and analyzing interconnections of the circuit units indicating that the input and output of which circuit unit are connected to which circuit unit;

B2) computing the number of emulators, the circuit scale of each emulator, and the circuit scale of each circuit unit, where the number of emulators and the circuit scale of each emulator are manually given by the user, and the circuit scale of each circuit unit is estimated by reading the hardware description language for the corresponding circuit unit;

B3) reading the hardware description language of the circuit being verified as a whole, and storing the input and output of each of through paths contained in each circuit unit; and B4) dividing the circuit being verified on the basis of the information obtained in the above-described steps B1 through B3 so that the number of through paths is minimized. For example, by searching for through paths for all combinations whereby the circuit units constituting the circuit being verified are allocated to the plurality of emulators, and selecting the combination with the lowest number of through paths, the method of division can be determined. At that time, the number of communications between emulators can be further reduced if division can be performed so that a divided circuit is approximately equivalent to the circuit scale that can be emulated by a single emulator.

A simple example will be described to aid in understanding circuit division based on through path information. It is assumed herein that four circuits A, B, C, and D are implemented to two emulators 1 and 2, and it is also assumed that the circuit scale of each circuit is about 40% of the circuit scale that enables implementing to each emulator.

Figures 10A, 10B, 10C:
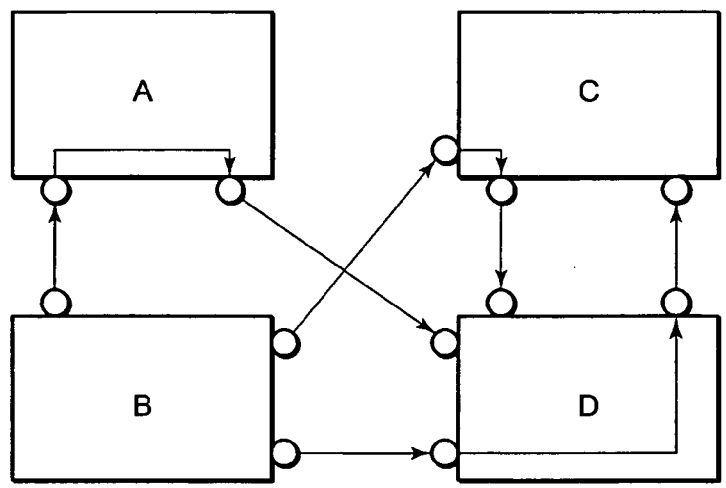
FIG. 10A is a block diagram showing through paths found in an entire circuit.
FIG. 10B is a diagram showing the number of through paths in each combination of circuits.
FIG. 10C is a diagram showing the relationship between a method of circuit division and the number of through paths.

As shown in FIG. 10A, a path that does no contain a storage device exists in circuit A between the input from circuit B and the output to circuit D, so there exists one through path each between circuits A and B and between circuits A and D. The through path search results shown in FIG. 10B are obtained by searching each circuit in the same manner.

Subsequently, based on the through path search results as shown in FIG. 10B, the number of through paths between emulators is counted for all cases in which the four circuits A, B, C, and D were allocated to the emulators 1 and 2. For example, when circuits A and B ate allocated to emulator 1, and circuits C and D are allocated to emulator 2, it is apparent that no through path is present between circuit A of emulator 1 and circuit C of emulator 2, one is present between circuits A and D, one is present between circuits B and C, and one is present between circuits B and D, making a total of three through paths.

When the number of through paths is counted for all combinations in this manner, it is found that implementing circuits A and B to emulator 1, and circuits C and D to emulator 2 as shown in FIG. 10C is the method of division that yields the lowest number of through paths between emulators.

1.3) Address Arrangement

Hereinafter, the address arrangement computation of step S104 in FIG. 8 will next be described in further detail. In step S104, the address arrangement of the input signals input, input/output signals in/out, and output signals output of the circuit portions (103.1 and 103.2) being verified that are each implemented to the emulators is determined based on the signal change rate so that the burst transfer is executed efficiently.

In a method of determining the address arrangement, addresses are arranged in descending order of the signal change rate among the input signals of the circuit portions being verified that are each implemented to the emulators. For the output signals, addresses are also arranged in the same manner in descending order of the signal change rate. At this time, an input signal and an output signal may have the same address. By arranging the same address, the address decoder can be reduced in size, and in such a case as when the bus interface 101, the communication circuit 102, and the circuit portion 103 being verified are emulated by a single programmable device, the scale of a circuit that can be implemented to the circuit portion 103 being verified can be enlarged. By arranging addresses in descending order of the signal change rate, burst transfer can be used efficiently, so the time needed for data transfer can be reduced, resulting in enhanced circuit verification speed.

A specific example of address arrangement will be given using the bus structure shown in FIG. 1. Here, it is assumed that circuits implemented to the circuit portions 103.1 and 103.2 being verified are denoted by A and B, respectively, and the output signal of circuit A is transmitted to circuit B as transmit data TxD via the bus 10 and becomes the input signal of circuit B. Furthermore, it is assumed that the data width of the bus 10 is 32 bits; the output signal of circuit A is composed of the two types of 32-bit data V and W, and two types of 16-bit data X and Y outputted at the same timing; the data V has a signal change rate of 1; X and Y have a signal change rate of 0.9, and W has a signal change rate of 0.01.

In this case, since the output signals V, W, X, and Y are arranged in the address space of the bus 10 in descending order of the signal change rate, address 0×0 is allocated to data V, address 0×4 is allocated to data X and Y, and the data W with the lowest signal change rate is placed at address 0×8, for example.

Since arrangement is made in descending order of the signal change rate in this manner, sets of data having high signal change rates are arranged at proximate or consecutive addresses and have a high probability of changing together. Consequently, in the case of the bus 10 supporting burst transfer, the number of burst transfers increases in which changed data arranged at consecutive addresses are bundled together, resulting in improved data transfer speed with great efficiency.

In the case of a PCI bus, for example, two cycles are needed for a single write, so a total of four cycles is usually needed when transferring data V, X and Y. In contrast, a PCI bus burst transfer is utilized in the, present embodiment, and the same data V, X, and Y can be transferred in three cycles. The ability to perform this transfer in one less cycle of time translates to an extremely large effect when applied in an actual system.

1.4) Operation Verification

Here, it is assumed that almost all of the output signals of one emulator become the input signals of another emulator an output signal of one emulator that is not connected to another emulator is the output signal of the circuit being verified or the observation signal of the higher-level computer system 12; and an input signal of the circuit being verified that is not connected to an output signal of another emulator is the input signal of the top-level circuit of the circuit being verified, wherein all of these signals are controlled by the bus controller 11. It is further assumed that there are no through paths in this case.

Figure 11:
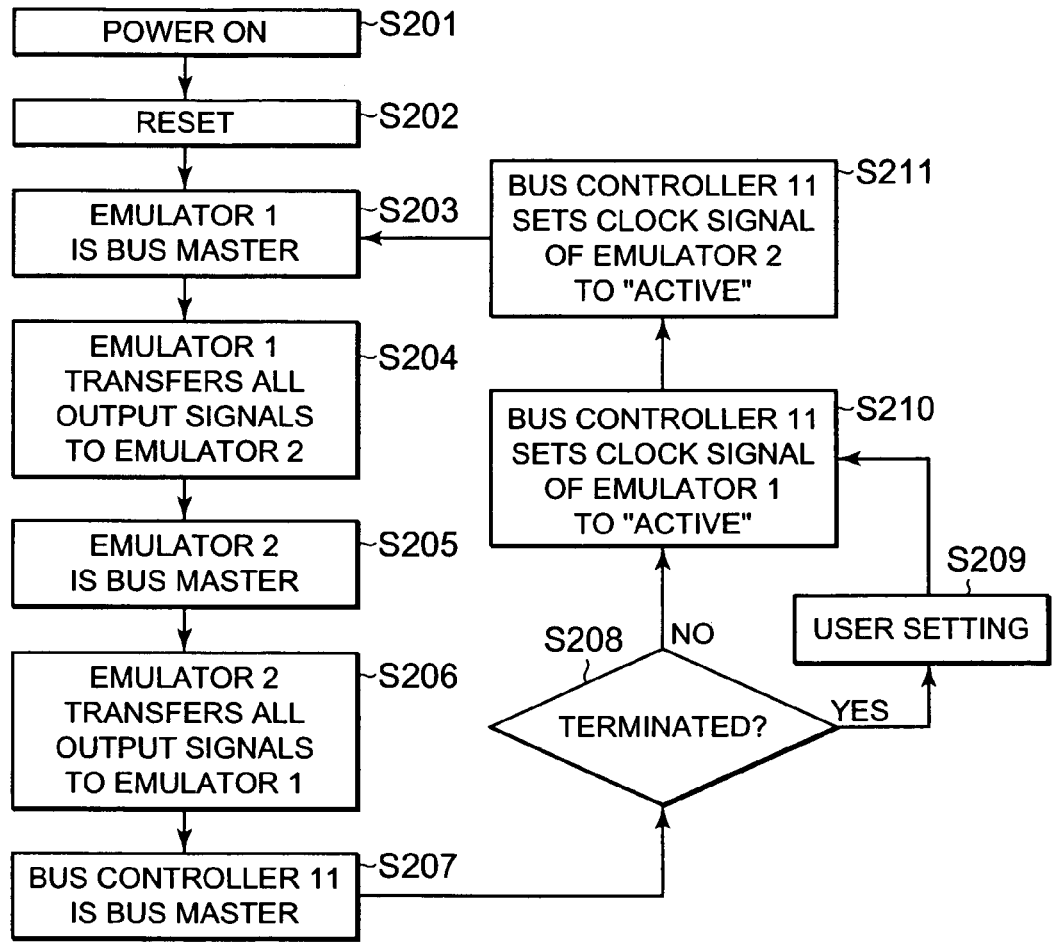
FIG. 11 is a flowchart showing an operation of the operation verification device according to the first embodiment.

Referring to FIG. 11, first, the power to all of the emulators 1 and 2 and the bus controller 11 is turned on (step S201). The bus controller 11 then determines a value for each input signal of a top-level circuit (which is assumed to be in emulator 1) of the circuit being verified and sets to "active" the reset signal RST of the circuit portion 103.1 being verified via the communication circuit 102.1 according to a command from the higher-level computer system 12. The reset signal RST of the circuit portion 103.2 being verified is also set to "active" in the same manner via the communication circuit 102.2 for the emulator 2. The circuit being verified is reset by these operations (step S202).

The emulator 1 then requests the bus control right in order to make the value of the output signal of the circuit portion 103.1 being verified identical to the value of the input signal of the circuit portion 103.2 being verified in the emulator 2. Since the input signals of the circuit portions being verified that are implemented to the emulators are indeterminate directly after resetting, it is necessary to set all output signals of one of the circuit portions implemented to emulators 1 and 2 as the inputs of the other. Therefore, the control circuit 204 of the communication circuit 102 sets the master request RQ to "active" when the reset signal RST of the circuit portion being verified becomes "active." This occurs simultaneously in the emulators 1 and 2, but the bus controller 11 gives the bus control right to the emulator 1 in advance and makes the emulator 1 the bus master (step S203). The bus controller 11 may also give the bus control right to the emulator 2 in advance.

The emulator 1 that has received the bus control right writes to the emulator 2 the output signals and input/output signals of the circuit portion implemented to the emulator 1, and makes the input signal of the circuit portion 103.2 identical to the output signal of the circuit portion 103.1 (step S204). The emulator 1 then surrenders the bus control right.

Subsequently, the emulator 2 requests the bus control right to assign the output signal of the circuit portion 103.2 to the input signal of the circuit portion 103.1 in the emulator 1, and the bus controller 11 gives to the emulator 2 the right to control the bus (step S205).

The emulator 2 that has received the bus control right writes to the emulator 1 the output signals and input/output signals of the circuit portion implemented to the emulator 2, and makes the input signal of the circuit portion 103.1 identical to the output signal of the circuit portion 103.2 (step S206). The emulator 2 then surrenders the bus control right.

The bus controller 11 then receives the bus control right (step S207), and when the break condition, which was set at the time of startup by the higher-level computer system 12, is satisfied (step S208: YES), the process is suspended and in the standby state until a command arrives from the higher-level computer system 12 (step S209). However, the state of the process is suspended in the step directly after resetting, and therefore a command from the higher-level computer system 12 is awaited. When the break condition given by the higher-level computer system 12 is not satisfied (step S208: NO), the process proceeds to step S210.

When the break condition is satisfied (step S208; YES), the process is in the standby state until an instruction is received from the user via the user interface 13 as to what type of operation to perform next (step S209). Commands that can be inputted by the user mainly include break setting, a step command, how many cycles to operate without consulting the user, and the like. All of these commands are stored by the bus controller 11 via the higher-level computer system 12. The bus controller 11 continually determines whether a set condition is satisfied (step S208).

The bus controller 11 then sets to "active" the clock signal CLK fed to the circuit portion 103.1 implemented to the emulator 1 (step S210). After the clock signal CLK has been set to "active," the emulator 1 requests the bus control right when the output signal of the circuit portion 103.1 being verified in the emulator 1 has changed, but the bus controller 11 does not yet respond thereto.

Subsequently, the bus controller 11 sets to "active" the clock signal CLK fed to the circuit portion 103.2 implemented to the emulator 2 (step S211). After the clock signal CLK has been set to "active," the emulator 2 then requests the bus control right when the output signal of the circuit portion 103.2 being verified in the emulator 2 has changed, but the bus controller 11 does not yet respond thereto. Control returns to step S203 in this manner, and the steps S203 to S211 described above are repeatedly performed.

As described above, since the emulators having the circuit portions implemented thereto can also be the bus master, the emulator that has become the bus master can transfer only the changed signal to the other emulator, resulting in the reduced number of communications between the emulators.

2. Second Embodiment 2.1) System Structure

Figure 12:
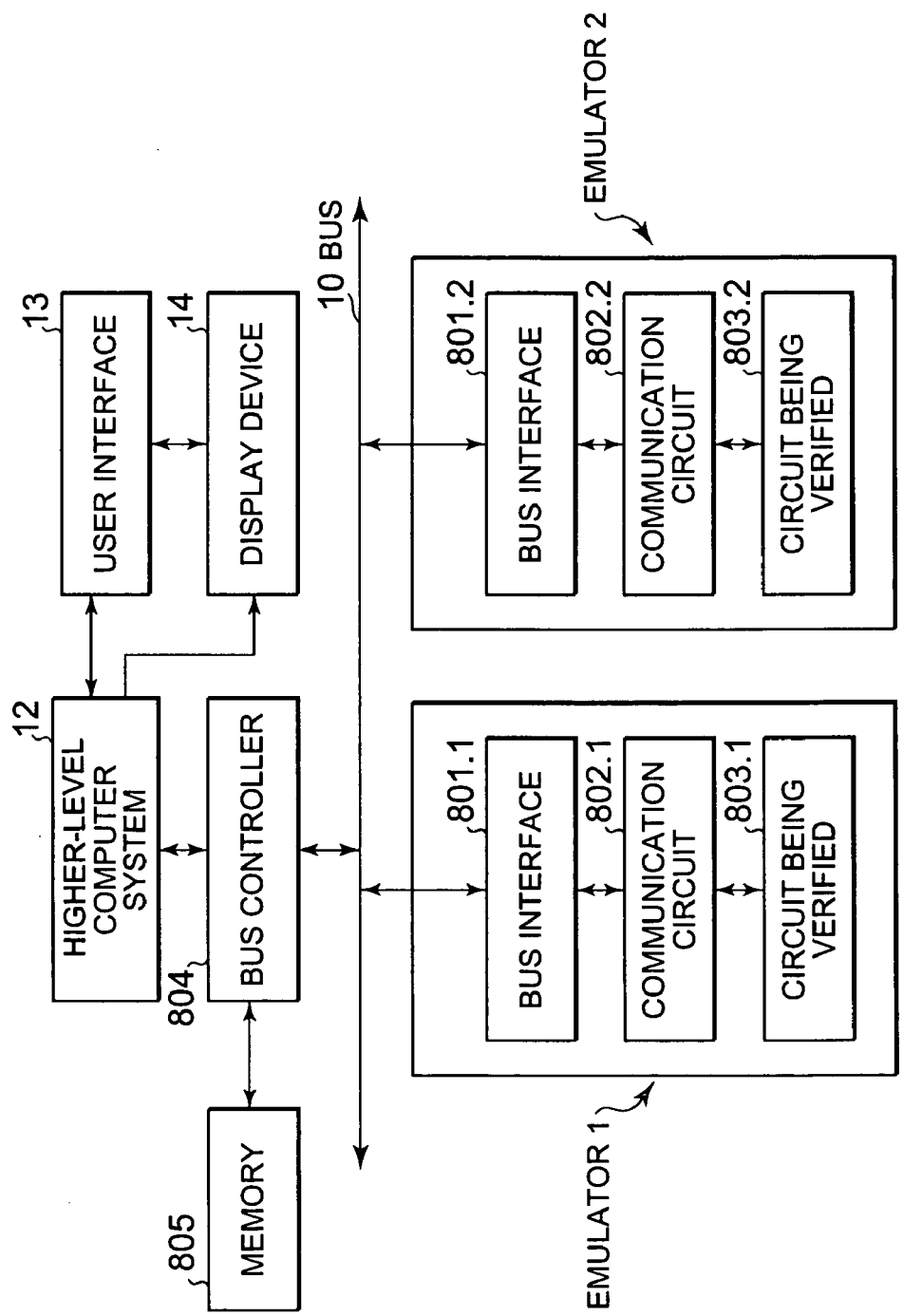
FIG. 12 is a schematic block diagram showing a circuit verification device according to a second embodiment of the present invention.

As shown in FIG. 12, the emulators 1 and 2 are connected by the bus 10, which is further connected to a bus controller 804, as in the case of the first embodiment. However, components other than the bus controller 804 cannot become the bus master in the second embodiment, and the emulators 1 and 2 always operate as slave devices of the bus.

The bus controller 804 also has memory 805 for retaining in sequence the values of signals designated within the circuit being verified. The user indicates in advance to the bus controller 804 via the user interface 13 which signal in the circuit being verified will be designated. Fr example, a signal in which the break condition is set can be designated in advance.

Since the emulators 1 and 2 always operate as slave devices of the bus, there is no need for either of the bus interface 801 and communication circuit 802 in the emulators 1 and 2 to support bus master operation, and therefore a simpler structure can be achieved.

Figure 13:
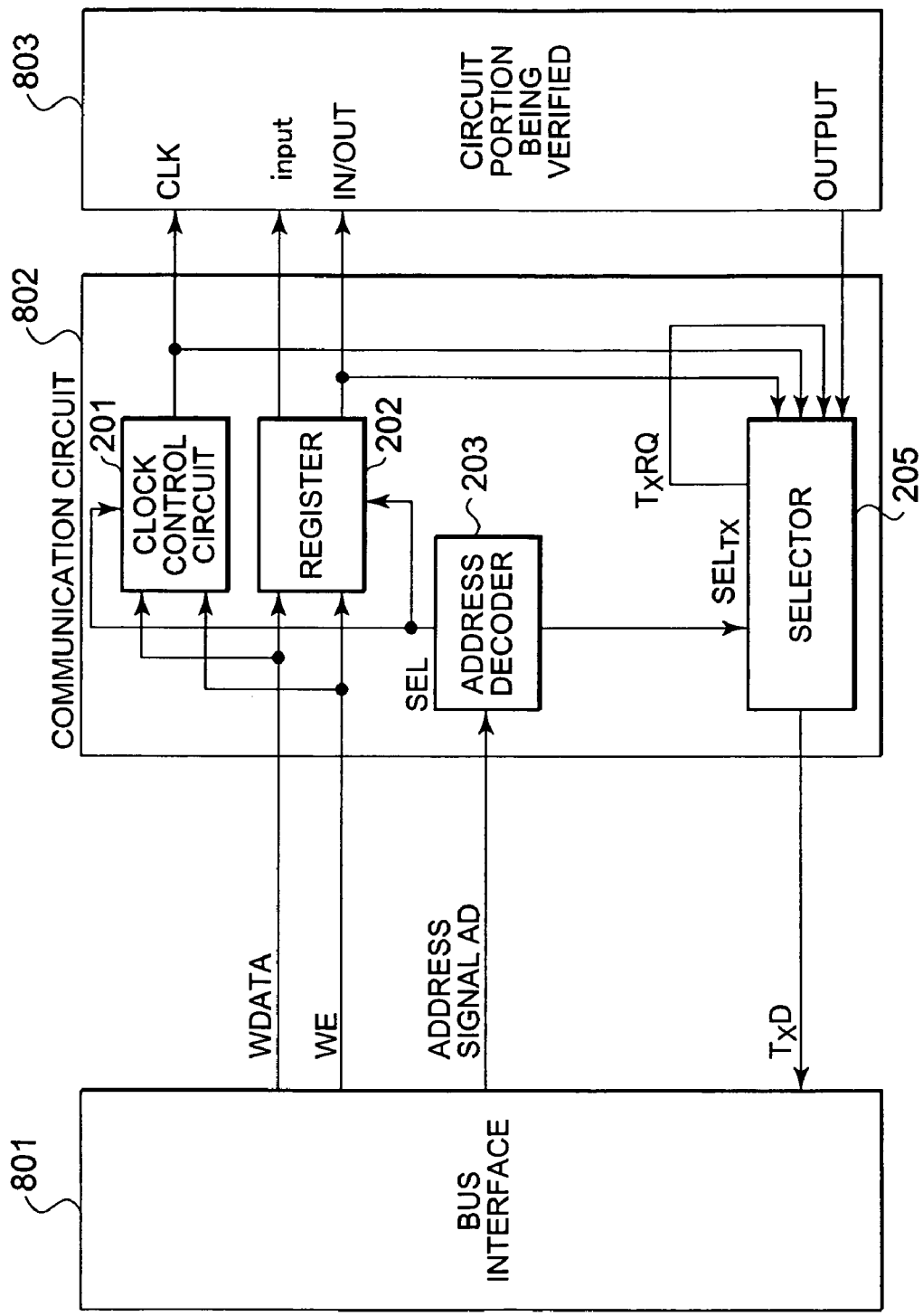
FIG. 13 is a block diagram showing the detailed structure of an emulator in the second embodiment of the present invention.

Referring to FIG. 13, the communication circuit 802 in emulators 1 and 2 has the structure of the communication circuit 102 in the first embodiment, but without the control circuit 204. Therefore, blocks having the same function and the same signals as those in FIG. 2 are denoted by the same reference numerals/symbols, and description thereof will be omitted.

In FIG. 13, the transmit request signal TxRQ outputted from the selector 205 becomes the input signal of the selector 205 itself. Since the transmit request signal TxRQ is outputted from the change detection circuit 604 as described before, when it is inputted to the drive circuit of the selector 205, it can be known which address of the output signal of the circuit portions 803 being verified has a value that has changed from that in the previous cycle. This function can eliminate unnecessary data transfer, and the speed of operation can also be enhanced even in a system in which components other than the bus controller cannot become the bus master.

Figure 14:
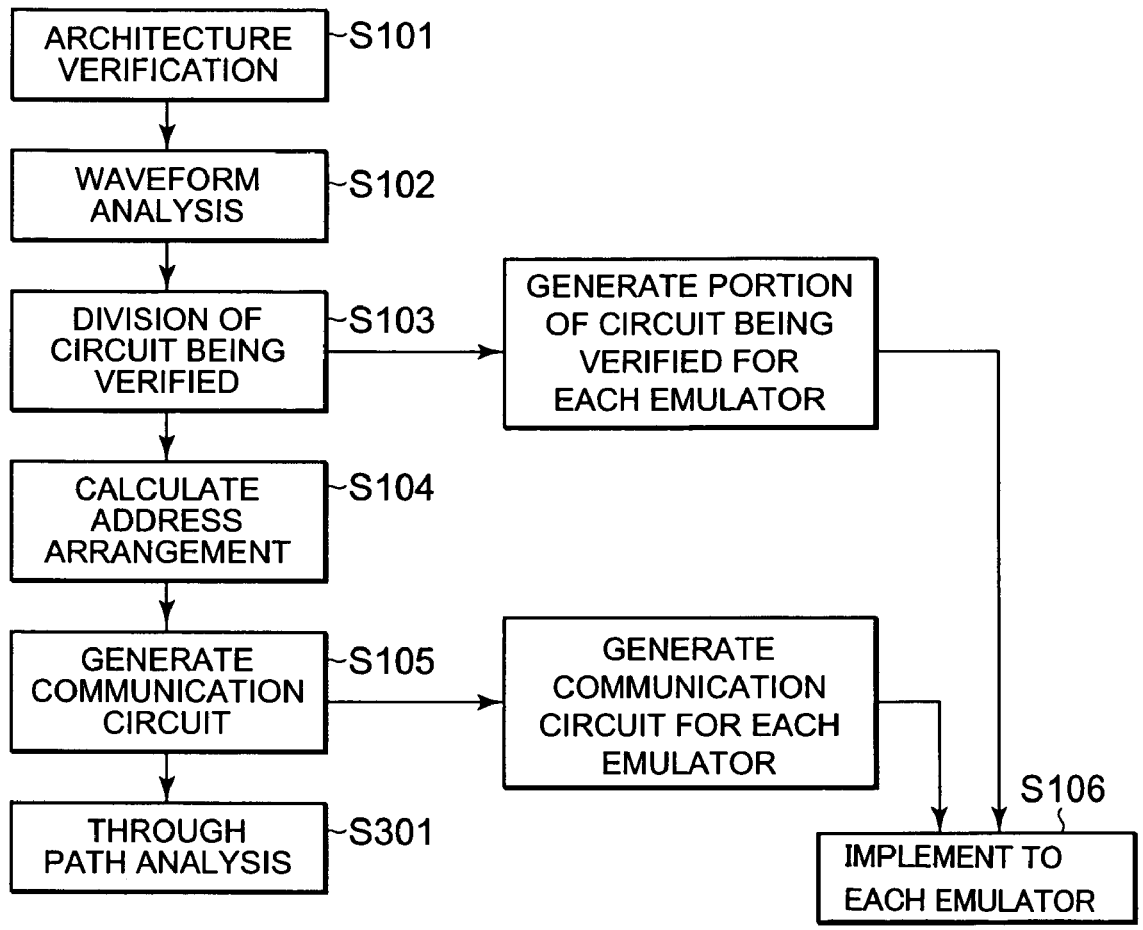
FIG. 14 is a flowchart showing the overall flow from division of the circuit to be verified to mounting the circuit in a plurality of emulators in the second embodiment.

Referring to FIG. 14, steps whose functions are the same as those in the first embodiment shown in FIG. 8 are denoted by the same reference numerals, and description thereof will be omitted. In the implementation of a circuit to be verified according to the second embodiment, a step S301 for analyzing the through paths of the circuit portions implemented to the emulators is added. In step S301, the through paths of the circuit portions implemented to the emulators are searched for and used in the operation of the bus controller 804 described hereinafter.

2.2) Through Path

As defined previously, the term "through path" refers to a path that includes an internal path that does not have any storage device between the input and the output of a circuit portion being verified.

Figure 15:
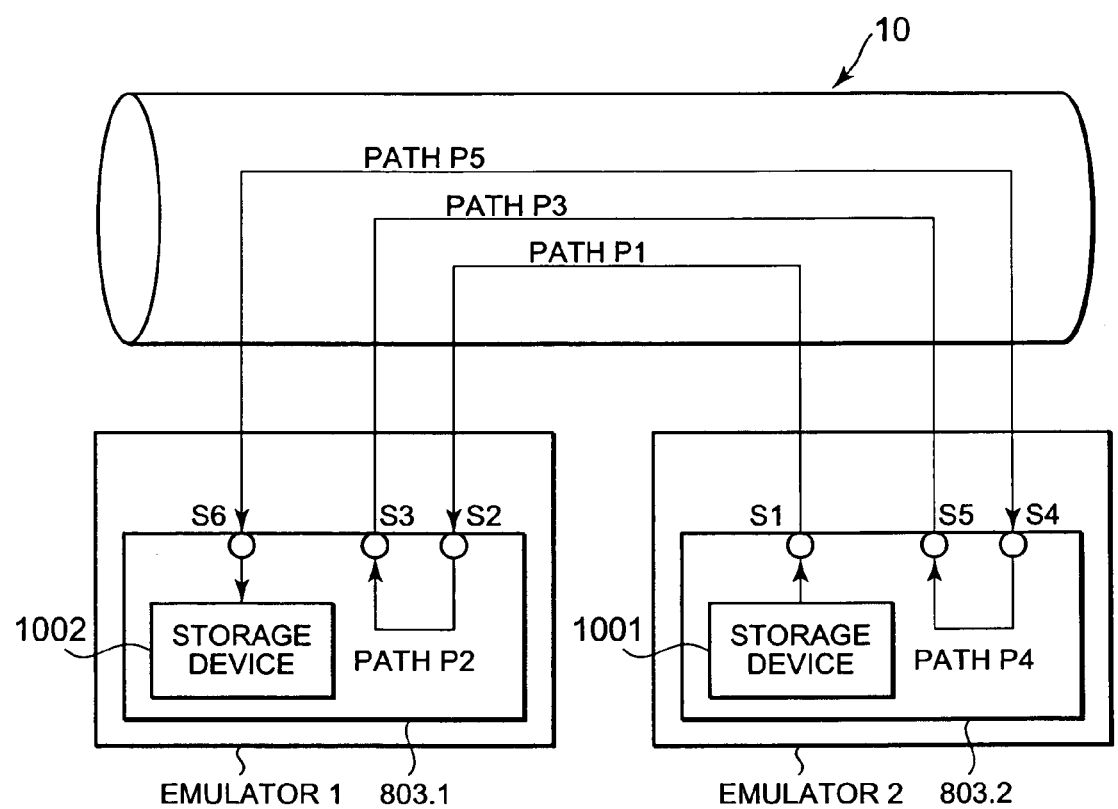
FIG. 15 is a schematic diagram depicting an example of through paths between emulators.

FIG. 15 illustrates an example of through paths between emulators. In this example, a path P2 that does not include any storage device is present between the input signal S2 and output signal S3 of the circuit portion 803.1 being verified, and a path P4 that does not include any storage devise is present between the input signal S4 and output signal S5 of the circuit portion 803.2 being verified. In this case, if the signal S1 that is the output of the storage device 1001 included in the circuit portion 803.2 being verified is connected via the path P1 to the input signal S2 of the circuit portion 803.1 being verified, the output signal S3 of the circuit portion 803.1 being verified is connected via the path P3 to the input signal S4 of the circuit portion 803.2 being verified, and the output signal S5 of the circuit portion 803.2 being verified is connected via the path P5 to a signal S6 that serves as the input of the storage device 1002 included in the circuit portion 803.1 being verified, then the path from the storage device 1001 to the storage device 1002 through the paths P1, P2, P3, P4, and P5 becomes a through path.

2.3) Operation Verification

In the operation verification device according to the second embodiment, as described before, only the bus controller 804 becomes the bus master. Accordingly, setting of the input signals, reading of the signals, and other operations involving the emulators are all performed by the bus controller 804. The history of signals designated in advance by the user is also sequentially stored in the memory 805.

Figure 16:
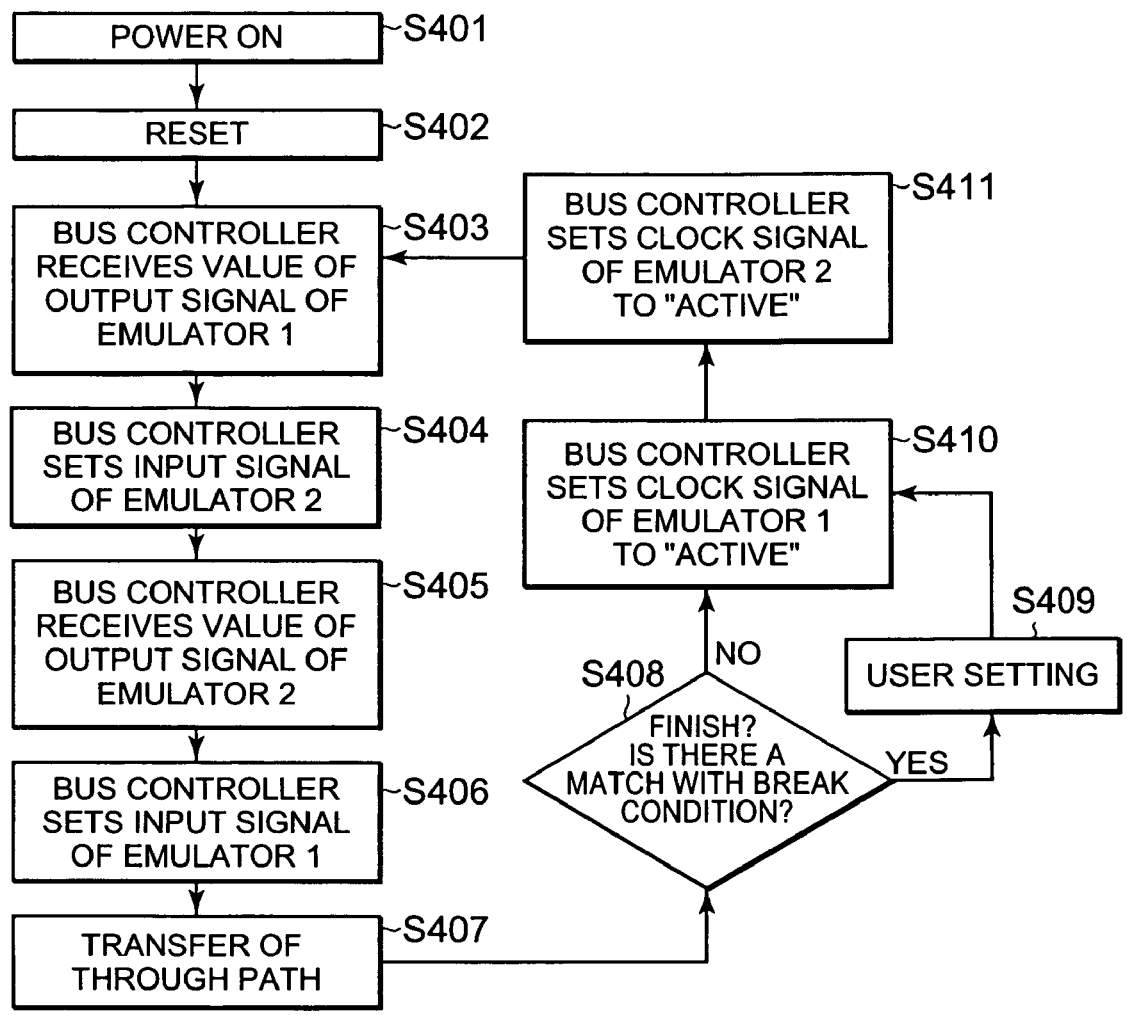
FIG. 16 is a flowchart showing an operation of the operation verification device according to the second embodiment of the present invention.

As shown in FIG. 16, when te power is turned on (step S401) and reset processing is performed as described in FIG. 11 (step S402), the bus controller 804 reads an output signal of the emulator 1 (step S403) and sets an input signal of the emulator 2 that will be connected to the output signal of the emulator 1 (step S404). Similarly, the bus controller 804 reads an output signal of the emulator 2 (step S405) and sets an input signal of the emulator 1 that will be connected to the output signal of the emulator 2 (step S406).

In order to prevent unnecessary reading when the output signal of an emulator is read, it is preferable that the transmit request signal TxRQ from the change detection circuit of the selector 205 be read out and only the address that has changed read in. However, reading all at once by burst transfer is utilized when doing so is faster than reading out the transmit request signal TxRQ. There is a potential for an unnecessary read-in of data when readouts are performed by burst transfer, but the read-in speed is ultimately higher when a burst transfer is used Subsequently the bus controller 804 transfers the data passing through the through paths analyzed in advance in step S301 of FIG. 14 (step 3407). The bus controller 804 then determines whether the break condition stored in the memory 805 is satisfied (step S408), and when satisfied (step S408: YES), the state of the process is suspended and is kept in the standby state until the user issues an instruction via the user interface 13 as to what type of operation to perform next (step S409). When the break condition is not satisfied (step S408: NO), the process proceeds to step S410. However, when resetting, the process always proceeds to step S409.

In the user-setting step S409, the user can set a break setting, a step command, and how many cycles to operate without consulting the user, and the like. The history of set signals is stored in the memory 805 at that time, so the user can refer via the display device 14 to past values for the signals thus set, which aids in circuit debugging and the like.

The bus controller 804 then sets to "active" the clock signal CLK fed to the circuit portion 103.1 implemented to the emulator 1 (step 5410), and sets to "active" the clock signal CLK fed to the circuit portion 103.2 implemented to the emulator 2 (step S411), after which the process returns to step S403 and repeats steps S403 through S411 described above, the same as in FIG. 11.

Hereinafter, transfer of through paths in step 3407 will next be described using as an example the through paths shown in FIG. 15. First, the value of the output signal S1 of the storage device 1001 has been already determined by the reset processing of step S402. Subsequently, the value of the output signal S1 has been transferred to the input signal S2 of the emulator 1 by steps S405 and S406. As described above, since the paths P1 through P5 constitute a through path, in the through path transfer step S407, the value of the output signal S3 of the circuit portion 103.1 being verified is transferred to the input signal S4 of the circuit portion; 103.2 being verified, and the output signal S5 of the circuit portion 103.2 being verified is transferred to the input signal S6 of the circuit portion 103.1 being verified. As described above, the signal transfer is performed by the bus controller 804 when reset or when the value of the output signal S1 has changed from its previous value. Also, as described above, when there is a plurality of signals of through paths, those signals can be transferred in bundles or a burst transfer can be utilized by arranging those signals at the same address or at proximate addresses in the address space, which causes the time required for through path transfer to be reduced.

3. Third Embodiment

In the first and second embodiments described above, the circuit being verified was divided in two parts, which were each implemented to the emulators 1 and 2, but the present invention is not limited to such a two-part structure. As described above, the circuit being verified can be divided into a desired number of parts so as to minimize the number of communications between emulators after this division has been performed. The emulators, each of which has the basic structure described above, are interconnected by the bus 10, and altogether execute the operation verification of the circuit being verified regardless of how it is divided.

According to the present invention, it is easy to divide the circuit being verified into a plurality of simulation devices, that is, emulators and/or simulators, and to interconnect them by the bus 10 in the same manner. As a third embodiment of the present invention, the operation verification device whereby two emulators and one simulator are connected by the bus 10 will next be described.

Figure 17:
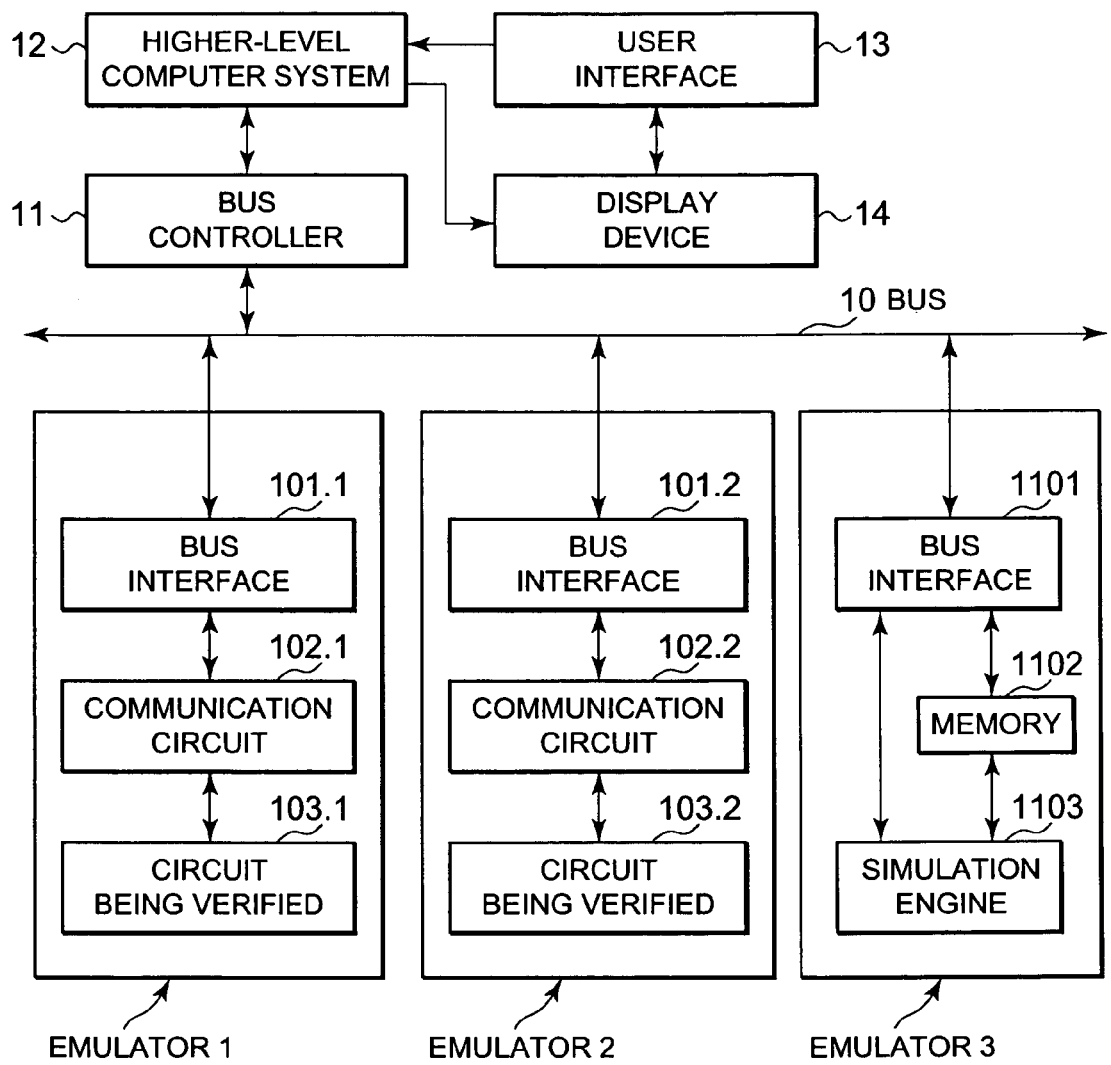
FIG. 17 is a schematic block diagram showing a circuit verification device according to a third embodiment of the present invention.

Referring to FIG. 17, in the present embodiment, the circuit portions 103.1 and 103.2 being verified are implemented to the emulators 1 and 2, respectively, in the same manner as in the first embodiment, and a simulator 3 for actually operating the logic section of the circuit being verified is further added to the bus 10.

The simulator 3 is composed of a bus interface 1101 for communicating with the bus 10; memory 1102; and a simulation engine 1103 for actually operating the logic portion of the circuit being verified. The memory 1102 temporarily retains the input signal and output signal of the circuit portion simulated by the simulation engine 1103. The simulation engine 1103 is of an event-driven type, so calculation is executed by variation of the input signal, and the output signal, which is the result of the calculation, is written in the memory 1102.

The bus interface 1101 transfers to a destination emulator only the data at a position whose value has changed from that of the previous cycle among the output signals of the simulation engine 1103 stored in the memory 1102, the same as the bus interface 101 and communication circuit 102 of the emulator.

In the operation verification device according to the present embodiment, the bus controller 11, the emulators 1 and 2, and the simulator 3 can all become the bus master of the bus 10, the same as in the first embodiment.

Figure 18:
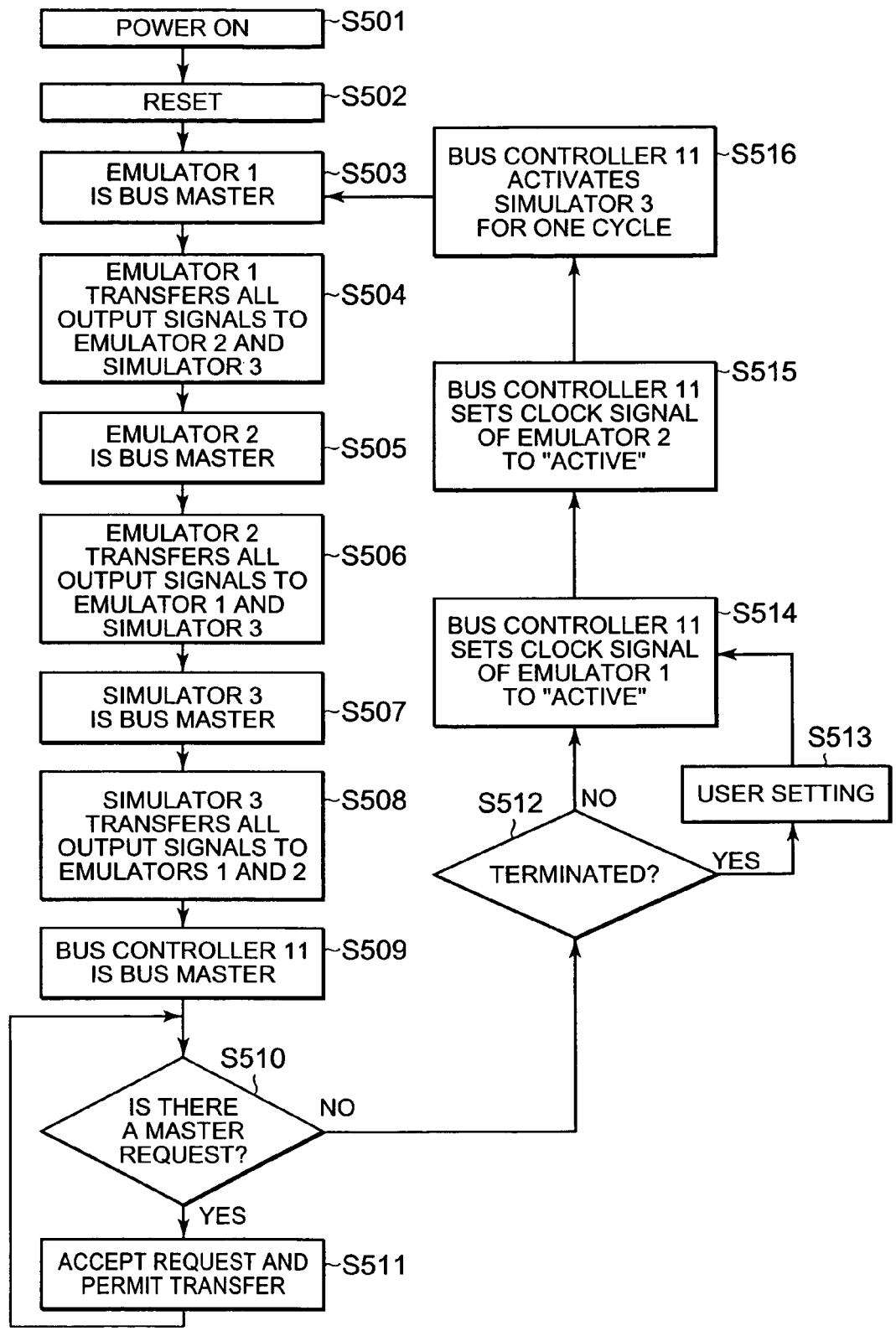
FIG. 18 is a flowchart showing an operation of the operation verification device according to the third embodiment of the present invention.

As shown in FIG. 18, when the power is turned on (step S501) and the reset processing is performed as described in FIG. 11 (step S502), the emulator 1 requests the bus control right and becomes the bus master (step S503).

The emulator 1 that has become the bus master transfers the changed output signal of the circuit portion 103.1 being verified as the input signal of the circuit portion 103.2 being verified in the emulator 2, and as the input signal retained in the memory 1102 of the simulator 3 (step S504). The emulator 1 then surrenders the bus control right.

Subsequently, the emulator 2 requests the bus control right and becomes the bus master (step S505). The emulator 2 that has become the bus master transfers the changed output signal of the circuit portion 103.2 being verified as the input signal of the circuit portion 103.1 being verified in the emulator 1, and as the input signal retained in the memory 1102 of the simulator 3 (step S506). The emulator 2 then surrenders the bus control right.

The simulator 3 then requests the bus control right and becomes the bus master (step S507). The simulator 3 that has become the bus master transfers the changed output signal of the memory 1102 as the input signal of the circuit portion 103.1 being verified in the emulator 1 and of the circuit portion 103.2 being verified in the emulator 2 (step S508). The simulator 3 then surrenders the bus control right.

The bus controller 11 then receives the bus control right (step S509) and determines whether a master request RQ is present (step S510). When a master request RQ is present. (step S510: YES), the request is accepted, permission for transfer is granted (step S511), and the process returns to step S510. When there is no master request RQ (step S510: NO), it is determined whether the break condition is satisfied (step S512). When satisfied (step S512: YES), the state of the process is suspended and user setting is performed as described previously (step S513), and when not satisfied (step S512: NO), the process continues uninterrupted to step S514. However, when resetting, the process always proceeds to step S512.

Thereafter, the bus controller 11 sets to "active" the clock signal CLK fed to the circuit portion 103.1 implemented to the emulator 1 (step S514), and then sets to "active" the clock signal CLK fed to the circuit portion 103.2 implemented to the emulator 2 (step S515).

The bus controller 11 then transmits to the bus interface 1101 of the simulator 3 a request to proceed one cycle, thereby modifying the clock signal in the simulation engine 1103 (step S516). When the input signal of the circuit being operated by the simulation engine 1103 has changed, the bus interface 1101 not only writes the value in the memory 1102 at the steps S504 and S506, but also stores which signal has changed in what way and then notifies the simulation engine 1103 of signals that have changed at the step S516. The simulation engine 1103 performs calculation to reflect the change and executes the circuit simulation according to this notification of input signal variation. The results of this simulation are written in the memory 1102 Control thus returns to step S503, and steps S503 through S516 described above are repeated thereafter.

4. Fourth Embodiment

Figure 19:
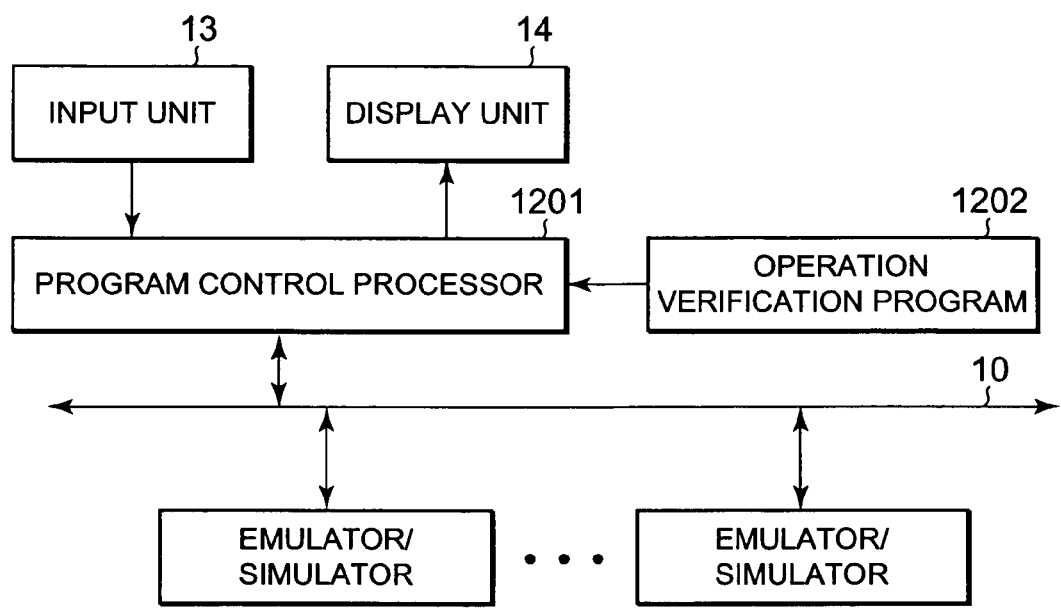
FIG. 19 is a schematic block diagram showing a circuit verification device according to a fourth embodiment of the present invention.

FIG. 19 shows an operation, verification device according to a fourth embodiment of the present invention. In the present embodiment, a program control processor 1201 is connected to the bus 10, and the functions of the bus controller 11 and the higher-level computer system 12 described above are performed by the program control processor 1201 running an operation verification program 1202 stored in the ROM. The operations executed by the program control processor 1201 are the same as the operations described in the first through third embodiments, so description thereof is omitted.

What is claimed is:

1. A circuit operation verification device for verifying by simulation a functional operation of a circuit to be verified, comprising:
    a plurality of simulation sections, each simulating functional operations of a corresponding circuit portion of a plurality of circuit portions into which the circuit is divided;
    a bus for connecting the plurality of simulation sections to enable mutual communications;
    a bus controller for controlling the bus; and
    to a higher-level controller for controlling the bus controller for communications among the plurality of simulation sections to verify the functional operation of the circuit to be verified,
    wherein the circuit comprises a plurality of circuit units, each of which comprises at least one circuit element, wherein the plurality of circuit units is divided based on a temporal communication occurrence pattern among the plurality of circuit units to generate the plurality of simulation sections, wherein input signals and output signals of each of the plurality of simulation sections are transmitted and received via the bus.

2. The circuit operation verification device according to claim 1, wherein the bus controller operates as a bus master, allowing any of the plurality of simulation sections to perform communication under control of the bus controller.

3. The circuit operation verification device according to claim 1, wherein input signals and output signals of each of the plurality of simulation sections are transmitted and received in burst transfer when signals to be transferred are placed at addresses in proximate to each other.

4. The circuit operation verification device according to claim 1, wherein each of the plurality of simulation sections transmits and receives a signal that has been changed.

5. The circuit operation verification device according to claim 1, wherein the plurality of simulation sections includes at least one emulator to which a corresponding circuit portion of the circuit is implemented.

6. The circuit operation verification device according to claim 5, wherein each of the at least one emulator comprises:
 a bus interface connected to the bus;
 a programmable circuit for emulating an operation of the corresponding circuit portion of the circuit; and
 a communication circuit for transferring a changed signal between the bus interface and the programmable circuit.

7. The circuit operation verification device according to claim 6, wherein the communication circuit comprises a register for retaining an input signal received from the bus interface.

8. The circuit operation verification device according to claim 6, wherein the communication circuit comprises a three-state buffer for transferring an output signal outputted from the programmable circuit to the bus interface, wherein the three-state buffer is provided by a programmable device.

9. The circuit operation verification device according to claim 1, wherein the plurality of simulation sections includes at least one simulator for simulating an operation of a corresponding circuit portion of the circuit by software.

10. The circuit operation verification device according to claim 1, wherein the plurality of circuit units is divided so that the number of communications occurring among the plurality of simulation sections is minimized.

11. A circuit operation verification device for verifying by simulation a functional operation of a circuit to be verified, comprising:
 a plurality of simulation sections each simulating functional operations of a corresponding circuit portion of a plurality of circuit portions into which the circuit is divided;
 a bus for connecting the plurality of simulation sections to enable mutual communications;
 a bus controller for controlling the bus; and
 a higher-level controller for controlling the bus controller for communications among the plurality of simulation sections to verify the functional operation of the circuit to be verified,
 wherein any of the plurality of simulation sections and the bus controller is allowed to be a bus master for communications, wherein input signals and output signals of each of the plurality of simulation sections are transmitted and received via the bus.

12. A circuit operation verification device for verifying by simulation a functional operation of a circuit to be verified, comprising:
 a plurality of simulation sections, each simulating functional operations of a corresponding circuit portion of a plurality of circuit portions into which the circuit is divided;
 a bus for connecting the plurality of simulation sections to enable mutual communications;
 a bus controller for controlling the bus; and
 a higher-level controller for controlling the bus controller for communications among the plurality of simulation sections to verify the functional operation of the circuit to be verified,
 wherein each of the plurality of simulation sections arranges input signals from the bus and output signals to the bus in a bus address space in descending order of a signal change rate, wherein input signals and output signals of each of the plurality of simulation sections are transmitted and received via the bus.

13. A circuit operation verification device for verifying by simulation a functional operation of a circuit to be verified, comprising:
 a plurality of simulation sections, each simulating functional operations of a corresponding circuit portion of a plurality of circuit portions into which the circuit is divided;
 a bus for connecting the plurality of simulation sections to enable mutual communications;
 a bus controller for controlling the bus; and
 a higher-level controller for controlling the bus controller for communications among the plurality of simulation sections to verify the functional operation of the circuit to be verified,
 wherein signals of through paths existing among the plurality of simulation sections are bundled and placed in a portion of the bus address space in each of the plurality of simulation sections, wherein input signals and output signals of each of the plurality of simulation sections are transmitted and received via the bus.

14. The circuit operation verification device according to claim 13, wherein the signals of the through paths are transferred in burst when the bus controller operates as a bus master.

15. A circuit operation verification device for verifying by simulation a functional operation of a circuit to be verified, comprising:
 a plurality of simulation sections, each simulating functional operations of a corresponding circuit portion of a plurality of circuit portions into which the circuit is divided;
 a bus for connecting the plurality of simulation sections to enable mutual communications;
 a bus controller for controlling the bus; and
 a higher-level controller for controlling the bus controller for communications among the plurality of simulation sections to verify the functional operation of the circuit to be verified,
 wherein the circuit comprises a plurality of circuit units, each of which comprises at least one circuit element, wherein the plurality of circuit units is divided so that the number of through paths among the plurality of simulation sections is minimized, to generate the plurality of simulation sections, wherein input signals and output signals of each of the plurality of simulation sections are transmitted and received via the bus.

16. A circuit operation verification method for verifying by simulation a functional operation of a circuit to be verified, comprising:
  a) dividing the circuit into a plurality of circuit portions based on a temporal communication occurrence pattern among the plurality of circuit portions when the circuit is divided into the plurality of circuit portions;
  b) connecting a plurality of simulation circuits so as to enable mutual communication via a bus, wherein each of the plurality of simulation circuits simulate functional operations of a corresponding circuit portion of the plurality of circuit portions; and
  c) verifying the functional operation of the circuit by communicating among the plurality of simulation circuits, wherein input signals and output signals of each of the plurality of simulation sections are transmitted and received via the bus.

17. The circuit operation verification method according to claim 16, wherein step a) comprises:
  a1) inputting a temporal communication occurrence pattern obtained from an arbitrary combination of a plurality of circuit units constituting the circuit; and
  a2) dividing the plurality of circuit units into a plurality of circuit portions based on the temporal communication occurrence pattern of the plurality of circuit units so that the number of communications occurring among the plurality of circuit portions is minimized.

18. The circuit operation verification method according to claim 16, wherein, in step b), input signals from the bus and output signals to the bus in each of the plurality of simulation circuits are arranged in a bus address space in descending order of a signal change rate.

19. The circuit operation verification method according to claim 16, wherein, in step c), input signals and output signals of each of the plurality of simulation circuits are transmitted and received in burst transfer when signals to be transferred are placed at addresses in proximate to each other.

20. The circuit operation verification method according to claim 16, wherein step a) comprises:
  a1) searching for through paths among a plurality of circuit units constituting the circuit; and
  a2) dividing the plurality of circuit units into a plurality of circuit portions so that the number of through paths among the plurality of circuit portions is minimized.

21. The circuit operation verification method according to claim 20, wherein, in step b), signals of through paths existing among the plurality of simulation circuits are bundled and placed in a portion of the bus address space in each of the plurality of simulation circuits.

22. The circuit operation verification method according to claim 21, wherein, in step c), the signals of the through paths are transferred in burst.

23. The circuit operation verification method according to claim 16, wherein step c) comprises:
  c.1) sequentially making the plurality of simulation circuits and a bus controller for controlling the bus a bus master;
  c.2) at a simulation circuit that has become the bus master, transferring an output signal to another simulation circuit; and
  c.3) at the bus controller that has become the bus master, setting the clock signal of each of the plurality of simulation circuits to active after determination of a break condition.

24. The circuit operation verification method according to claim 16, wherein step c) comprises:
  c.1) at the bus controller for controlling the bus, setting transferred signals of the plurality of simulation circuits to the simulation circuits;
  c.2) transferring signals on the through paths among the plurality of circuit units; and
  c.3) at the bus controller, setting the clock signal of each of the plurality of simulation circuits to active after determination of a break condition.

25. A computer-readable medium containing a program for causing a computer to verify by simulation a functional operation of a circuit to be verified, the program, when executed, causing the computer to perform steps comprising:
  a) dividing the circuit into a plurality of circuit portions so that the number of communications among the plurality of circuit portions is minimized when the circuit is divided into the plurality of circuit portions;
  b) connecting a plurality of simulation circuits so as to enable mutual communication via a bus, wherein the plurality of simulation circuits each simulate functional operations of a corresponding circuit portion of the plurality of circuit portions; and
  c) verifying the functional operation of the circuit by communicating among the plurality of simulation circuits, wherein input signals and output signals of each of the plurality of simulation sections are transmitted and received via the bus.

26. The computer-readable medium according to claim 25, wherein step a) comprises:
  a1) inputting a temporal communication occurrence pattern obtained from an arbitrary combination of a plurality of circuit units constituting the circuit; and
  a2) dividing the plurality of circuit units into a plurality of circuit portions based on the temporal communication occurrence pattern of the plurality of circuit units so that the number of communications occurring among the plurality of circuit portions is minimized.

27. The circuit computer-readable medium according to claim 25, wherein step a) comprises:
  a1) searching for a through path among a plurality of circuit units constituting the circuit; and
  a2) dividing the plurality of circuit units into a plurality of circuit portions so that the number of through paths among the plurality of circuit portions is minimized.

28. The computer-readable medium according to claim 25, wherein step c) comprises:
  c.1) sequentially making the plurality of simulation circuits and a bus controller for controlling the bus a bus master;
  c.2) at a simulation circuit that has become the bus master, transferring an output signal to another simulation circuit; and
  c.3) at the bus controller that has become the bus master, setting the clock signal of each of the plurality of simulation circuits to active after determination of a break condition.

29. The computer-readable medium according to claim 25, wherein step c) comprises:
  c.1) at the bus controller for controlling the bus, setting transferred signals of the plurality of simulation circuits to the simulation circuits;
  c.2) transferring signals on the through paths among the plurality of circuit units; and
  c.3) at the bus controller, setting the clock signal of each of the plurality of simulation circuits to active after determination of a break condition.

* * * * *